US012813105B2

(12) United States Patent
Choung et al.

(10) Patent No.: US 12,813,105 B2
(45) Date of Patent: Nov. 24, 2026

(54) DISPLAY APPARATUS AND METHOD OF MANUFACTURING THE SAME

(71) Applicant: Samsung Display Co., Ltd., Yongin-si (KR)

(72) Inventors: Jonghyun Choung, Yongin-si (KR); Youngrok Kim, Yongin-si (KR); Kyusoon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 273 days.

(21) Appl. No.: 18/473,099

(22) Filed: Sep. 22, 2023

(65) Prior Publication Data

US 2024/0107837 A1 Mar. 28, 2024

(30) Foreign Application Priority Data

Sep. 26, 2022 (KR) ........................ 10-2022-0121974

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC ......................... H10K 59/131; H10K 59/1201
USPC ............................................................ 257/72
See application file for complete search history.

(56) References Cited

U.S. PATENT DOCUMENTS 10,403,845 B2 9/2019 Lee et al.
10,516,011 B2 12/2019 Lee et al.
11,563,074 B2 1/2023 Cho et al.
2014/0312323 A1* 10/2014 Park ................ H10K 59/80516 438/23

(Continued)

FOREIGN PATENT DOCUMENTS

CN 113972252 A 1/2022
JP 2008135325 * 6/2008 ....... H10K 59/80522

(Continued)

OTHER PUBLICATIONS

English Machine Translation of JP2008135325 (Year: 2008).*

*Primary Examiner* — Dzung Tran
(74) *Attorney, Agent, or Firm* — Womble Bond Dickinson (US) LLP

(57) ABSTRACT

A display apparatus includes: a substrate; a transistor on the substrate, the transistor including a semiconductor layer and a gate electrode overlapping the semiconductor layer; an auxiliary wiring on the substrate and including a first sub-layer and a second sub-layer on the first sub-layer, the second sub-layer having a tip protruding from a point at where a bottom surface of the second sub-layer meets a lateral surface of the first sub-layer; an insulating layer on the transistor and having an opening overlapping the auxiliary wiring; and a light-emitting diode including a first electrode, a second electrode, and an intermediate layer, the first electrode being on the insulating layer and electrically connected to the transistor, the second electrode facing the first electrode, and the intermediate layer being between the first electrode and the second electrode. The second electrode directly contacting the lateral surface of the first sub-layer.

11 Claims, 15 Drawing Sheets

(56) References Cited

U.S. PATENT DOCUMENTS

| | | | | |
|---|---|---|---|---|
| 2016/0013436 | A1* | 1/2016 | Im .................... | H10K 59/80522 257/40 |
| 2016/0043341 | A1 | 2/2016 | Heo et al. | |
| 2017/0170246 | A1* | 6/2017 | Im ...................... | H10K 59/1315 |
| 2018/0062109 | A1 | 3/2018 | Kim | |
| 2018/0151647 | A1* | 5/2018 | Lee ...................... | H10D 86/441 |
| 2021/0036073 | A1* | 2/2021 | Cho ..................... | H10K 59/124 |
| 2021/0202655 | A1 | 7/2021 | Cho et al. | |
| 2022/0037616 | A1* | 2/2022 | Liu ...................... | H10K 59/122 |
| 2022/0102471 | A1 | 3/2022 | Jang et al. | |

FOREIGN PATENT DOCUMENTS

| | | | |
|---|---|---|---|
| KR | 10-2018-0061903 | A | 6/2018 |
| KR | 10-2019-0079265 | A | 7/2019 |
| KR | 10-2021-0086869 | A | 7/2021 |
| KR | 10-2022-0042815 | A | 4/2022 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2022-0121974, filed on Sep. 26, 2022, in the Korean Intellectual Property Office, the entire disclosure of which is incorporated herein by reference.

BACKGROUND

1. Field

Aspects of embodiments of the present disclosure relate to a display apparatus and a method of manufacturing the display apparatus.

2. Description of the Related Art

Generally, in a display apparatus, such as an organic light-emitting display apparatus, transistors are arranged in a display area to control brightness and the like of a light-emitting diode. The transistors are configured to control a corresponding light-emitting diode to emit light (e.g., a certain color light) in response to a data signal, a driving voltage, and a common voltage transferred thereto.

One electrode of a light-emitting diode may be configured to receive a voltage (e.g., a preset voltage) through a transistor, and another electrode thereof may be configured to receive a voltage through an auxiliary wiring.

SUMMARY

Embodiments of the present disclosure include a display apparatus including an auxiliary wiring having a tip without any unexpected damage, which may provide high-quality images by preventing a voltage drop of a light-emitting diode. However, this aspect and feature of the present disclosure is an example, and the present disclosure is not limited thereto.

Additional aspects and features will be set forth, in part, in the description that follows and, in part, will be apparent from the description or may be learned by practice of the described embodiments of the present disclosure.

According to an embodiment of the present disclosure, a display apparatus includes a substrate, a transistor on the substrate and including a semiconductor layer and a gate electrode overlapping the semiconductor layer, an auxiliary wiring on the substrate and including a first sub-layer and a second sub-layer on the first sub-layer, an insulating layer on the transistor and having an opening overlapping the auxiliary wiring, and a light-emitting diode including a first electrode, a second electrode, and an intermediate layer. The first electrode is on the insulating layer and electrically connected to the transistor, the second electrode faces the first electrode, and the intermediate layer is between the first electrode and the second electrode. The second sub-layer of the auxiliary wiring has a tip protruding from a point at which a bottom surface of the second sub-layer meets a lateral surface of the first sub-layer, and the second electrode directly contacts the lateral surface of the first sub-layer.

The display apparatus may further include a first conductive material portion and a second conductive material portion separated from each other by the tip of the second sub-layer of the auxiliary wiring, and each of the first conductive material portion and the second conductive material portion may include a same material as a material of the first electrode of the light-emitting diode.

The first conductive material portion may be on an upper surface of the auxiliary wiring, and the second conductive material portion may be adjacent to a lateral surface of the auxiliary wiring.

A thickness of the first sub-layer of the auxiliary wiring may be greater than a thickness of the second sub-layer of the auxiliary wiring, and the lateral surface of the first sub-layer of the auxiliary wiring may have an inclined surface tapered upwardly.

The first sub-layer of the auxiliary wiring may include at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo), and the second sub-layer of the auxiliary wiring may include at least one selected from indium tin oxide (ITO), titanium (Ti), molybdenum (Mo), and tungsten (W).

The auxiliary wiring may further include a third sub-layer opposite the second sub-layer with the first sub-layer therebetween.

The display apparatus may further include an electrode or a driving voltage line electrically connected to the semiconductor layer of the transistor.

The electrode or the driving voltage line may include a same number of sub-layers as a number of sub-layers in the auxiliary wiring.

A cross-sectional shape of the electrode or the driving voltage line may be different from a cross-sectional shape of the auxiliary wiring.

The insulating layer may be on the electrode or the driving voltage line, and a portion of the insulating layer may overlap a lateral surface of the electrode or the driving voltage line.

The display apparatus may further include an insulating layer between the substrate and the auxiliary wiring. The insulating layer includes a first portion overlapping the auxiliary wiring and a second portion not overlapping the auxiliary wiring and adjacent to the first portion. A thickness of the first portion may be greater than a thickness of the second portion.

According to an embodiment of the present disclosure, a method of manufacturing a display apparatus includes forming a transistor on a substrate, the transistor including a semiconductor layer and a gate electrode overlapping the semiconductor layer, forming an auxiliary wiring on the substrate, the auxiliary wiring includes a first sub-layer and a second sub-layer on the first sub-layer, the second sub-layer including a tip protruding from a point at which a bottom surface of the second sub-layer meets a lateral surface of the first sub-layer, forming an insulating layer on the transistor and having an opening overlapping the auxiliary wiring, and forming a light-emitting diode including a first electrode, a second electrode, and an intermediate layer, the first electrode being on the insulating layer and electrically connected to the transistor, the second electrode facing the first electrode, and the intermediate layer being between the first electrode and the second electrode. The second electrode directly contacts the lateral surface of the first sub-layer of the auxiliary wiring.

The method may further include forming an electrode or a driving voltage line electrically connected to the semiconductor layer of the transistor. The forming of the electrode or the driving voltage line and the forming of the auxiliary wiring may include forming a conductive stack including a first sub-layer and a second sub-layer on the first sub-layer, forming a first photoresist and a second photoresist on the conductive stack, forming the electrode or the driving voltage line by etching the conductive stack using the first photoresist as a mask, and forming the auxiliary wiring by etching the conductive stack using the second photoresist as a mask.

A lateral slope angle of the first photoresist may be less than a lateral slope angle of the second photoresist.

A cross-sectional shape of the electrode or the driving voltage line may be different from a cross-sectional shape of the auxiliary wiring.

The forming of the electrode or the driving voltage line by etching the conductive stack may include ashing the first photoresist, and removing an edge portion of the second sub-layer of the electrode or the driving voltage line not overlapping the ashed first photoresist.

The forming of the light-emitting diode may include forming the first electrode, forming the intermediate layer on the first electrode, and forming the second electrode on the intermediate layer.

The forming of the first electrode may include forming a conductive layer corresponding to the first electrode, the conductive layer including a first conductive material portion and a second conductive material portion separated from each other by the tip of the auxiliary wiring, forming a photoresist on the auxiliary wiring, and forming the first electrode by etching the conductive layer.

The first conductive material portion may be on an upper surface of the auxiliary wiring, and the second conductive material portion may be adjacent to a lateral surface of the auxiliary wiring.

The forming of the intermediate layer may include forming the intermediate layer contacting the lateral surface of the first sub-layer of the auxiliary wiring and a dummy intermediate layer on the auxiliary wiring. The dummy intermediate layer may be separated from the intermediate layer by the tip of the auxiliary wiring. The forming of the second electrode may include forming the second electrode contacting the lateral surface of the first sub-layer of the auxiliary wiring and a dummy electrode disposed on the auxiliary wiring. The dummy electrode may be separated from the second electrode by the tip of the auxiliary wiring.

A thickness of the first sub-layer of the auxiliary wiring may be greater than a thickness of the second sub-layer of the auxiliary wiring, and the lateral surface of the first sub-layer of the auxiliary wiring may have an inclined surface tapered upwardly.

The first sub-layer of the auxiliary wiring may include at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo), and the second sub-layer of the auxiliary wiring may include at least one selected from indium tin oxide (ITO), titanium (Ti), molybdenum (Mo), and tungsten (W).

The method may further include forming another insulating layer between the substrate and the auxiliary wiring, and the forming of the auxiliary wiring may include etching a portion of the other insulating layer not overlapping the auxiliary wiring.

BRIEF DESCRIPTION OF THE DRAWINGS

The above and other aspects and features of the present disclosure will be more apparent from the following description taken in conjunction with the accompanying drawings, in which.

DETAILED DESCRIPTION

Figure 1:
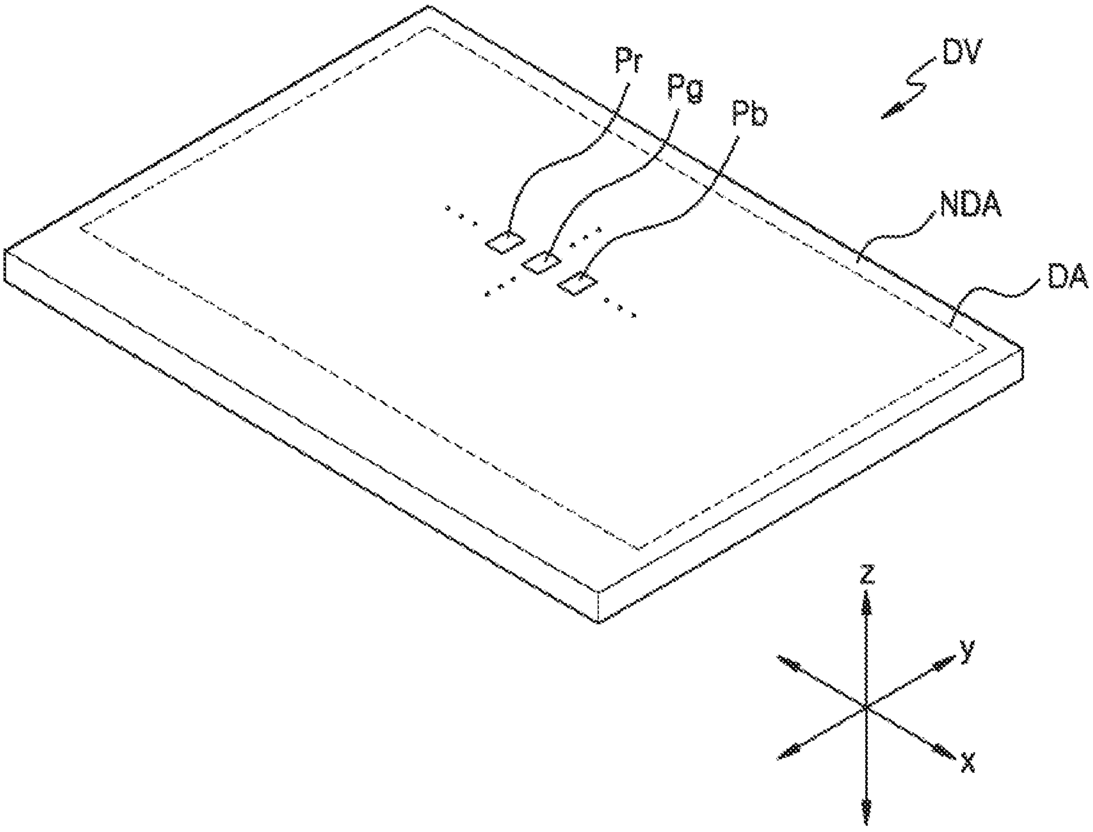
FIG. 1 is a schematic perspective view of a display apparatus according to an embodiment.

Reference will now be made, in detail, to embodiments, examples of which are illustrated in the accompanying drawings. The present disclosure may, however, have different forms and should not be construed as being limited to the descriptions set forth herein. Accordingly, the embodiments are merely described below, by referring to the figures, to explain aspects and features of the present description.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" or "at least one selected from a, b, and c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

When an embodiment may be implemented differently, a specific process order may be performed in the order different from the described order. As an example, two processes successively described may be simultaneously performed substantially and performed in the opposite order.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic perspective view of a display apparatus according to an embodiment.

Referring to FIG. 1, the display apparatus DV may have a display area DA and a non-display area NDA outside (e.g., around a periphery of) the display area DA. The display apparatus DV may be configured to display images through an array of a plurality of sub-pixels arranged two-dimensionally on an x-y plane in the display area DA. The plurality of sub-pixels includes a first sub-pixel, a second sub-pixel, and a third sub-pixel. Hereinafter, for convenience of description, an embodiment in which the first sub-pixel is a red sub-pixel Pr, the second sub-pixel is a green sub-pixel Pg, and the third sub-pixel is a blue sub-pixel Pb is described.

The red sub-pixel Pr, the green sub-pixel Pg, and the blue sub-pixel Pb are regions that respectively emit red, green, and blue light. The display apparatus DV may display images by using light emitted from the sub-pixels.

The non-display area NDA is a region that does not display an image and may entirely surround (e.g., entirely surround in a plane view or extend entirely around a periphery thereof) the display area DA. A driver or a main voltage line configured to provide electric signals or power to sub-pixel circuits may be arranged in the non-display area NDA. A pad may be arranged in the non-display area NDA, and the pad is a region to which electronic elements or a printed circuit board may be electrically connected.

As shown in FIG. 1, the display area DA may have a polygonal shape including a quadrangular shape. As an example, the display area DA may have a rectangular shape in which a horizontal length thereof is greater than a vertical length, a rectangular shape in which a horizontal length thereof is less than a vertical length, or a square shape. However, the display area DA may have various shapes, such as an elliptical shape or a circular shape, and is not particularly limited to any shape.

Figure 2:
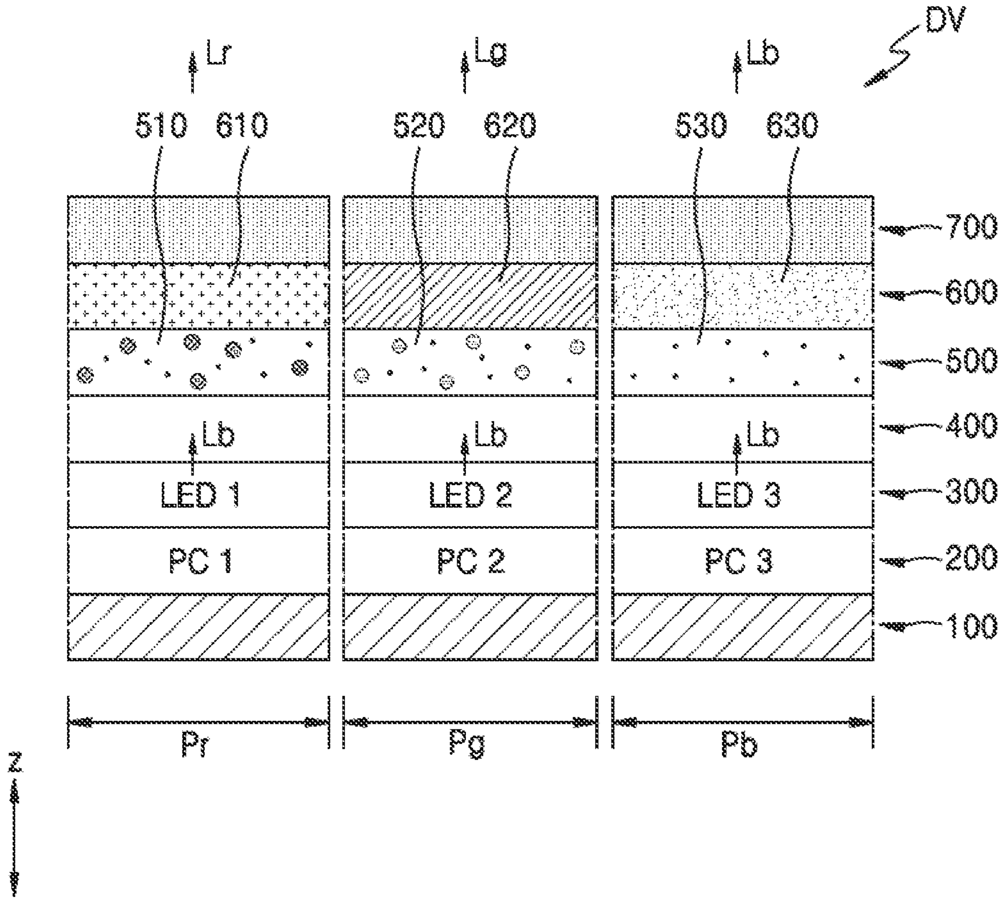
FIG. 2 is a schematic cross-sectional view of respective sub-pixels of the display apparatus according to an embodiment.

FIG. 2 is a schematic cross-sectional view of respective sub-pixels of the display apparatus DV according to an embodiment.

Referring to FIG. 2, the display apparatus DV may include a circuit layer 200 on a substrate 100. The circuit layer 200 may include first to third sub-pixel circuits PC1, PC2, and PC3. The first to third sub-pixel circuits PC1, PC2, and PC3 may be respectively and electrically connected to first to third light-emitting diodes LED1, LED2, and LED3 of a light-emitting diode layer 300.

The first to third light-emitting diodes LED1, LED2, and LED3 may each include an organic light-emitting diode including an organic material. In another embodiment, the first to third light-emitting diodes LED1, LED2, and LED3 may each include an inorganic light-emitting diode including an inorganic material. The inorganic light-emitting diode may include a PN-junction diode including inorganic semiconductor-based materials. When a forward voltage is applied to a PN-junction diode, holes and electrons are injected and energy created by recombination of the holes and the electrons is converted into light energy, and thus, light (e.g., light of a certain color) may be emitted. The inorganic light-emitting diode may have a width of several micrometers to hundreds of micrometers or several nanometers to hundreds of nanometers. In an embodiment, the light-emitting diode LED may be a light-emitting diode including quantum dots. An emission layer of the light-emitting diode LED may include an organic material, an inorganic material, quantum dots, an organic material and quantum dots, or inorganic material and quantum dots.

The first to third light-emitting diodes LED1, LED2, and LED3 may emit light of the same color. As an example, light (e.g., blue light Lb) emitted from the first to third light-emitting diodes LED1, LED2, and LED3 may pass through an encapsulation layer 400 and through a color conversion-transmissive layer 500 on the light-emitting diode layer 300.

The color conversion-transmissive layer 500 may include optical portions configured to convert the color light (e.g., blue light Lb) emitted from the light-emitting diode layer 300 or configured to transmit the light without converting the color light. As an example, the color conversion-transmissive layer 500 may include color converters (e.g., color conversion portions) and a transmitter (e.g., a transmission portion). The color converters are configured to convert light (e.g., blue light Lb) emitted from the light-emitting diode layer 300 to light of a different color, and the transmitter is configured to transmit light (e.g., blue light Lb) emitted from the light-emitting diode layer 300 without converting a color thereof. The color conversion-transmissive layer 500 may include a first color-converter 510 corresponding to the red sub-pixel Pr, a second color-converter 520 corresponding to the green sub-pixel Pg, and a transmitter 530 corresponding to the blue sub-pixel Pb. The first color-converter 510 may convert blue light Lb into red light Lr, the second color-converter 520 may convert blue light Lb into green light Lg, and the transmitter 530 may transmit blue light Lb without converting the blue light Lb.

A color layer 600 may be disposed on the color conversion-transmissive layer 500. The color layer 600 may include first to third color filters 610, 620, and 630, each having different colors. As an example, the first color filter 610 may be a red color filter, the second color filter 620 may be a green color filter, and the third color filter 630 may be a blue color filter.

Light that is color-converted or transmitted by the color conversion-transmissive layer 500 may have improved color purity by respectively passing through the first to third color filters 610, 620, and 630. In addition, the color layer 600 may prevent or reduce external light (e.g., light incident to the display apparatus DV from the outside of the display apparatus DV) from being reflected and viewed by a user.

A light-transmissive base layer 700 may be provided to the color layer 600. The light-transmissive base layer 700 may include glass or a light-transmissive organic material. As an example, the light-transmissive base layer 700 may include a light-transmissive organic material, such as an acryl-based resin.

In an embodiment, the light-transmissive base layer 700 is a substrate. For example, the color layer 600 and color conversion-transmissive layer 500 are formed on the light-transmissive base layer 700, and then, the color conversion-transmissive layer 500 may be integrated to face the encapsulation layer 400.

In another embodiment, after the color conversion-transmissive layer 500 and the color layer 600 are sequentially formed on the encapsulation layer 400, the light-transmissive base layer 700 may be directly coated and cured on the color layer 600. In an embodiment, another optical film, for example, an anti-reflection (AR) film and the like, may be disposed on the light-transmissive base layer 700.

The display apparatus DV having the above structure may include (or may be included in) electronic apparatuses configured to display moving images or still images, such as televisions, advertisement boards, screens for a theater, monitors, tablet personal computers, and the like.

Figure 3:
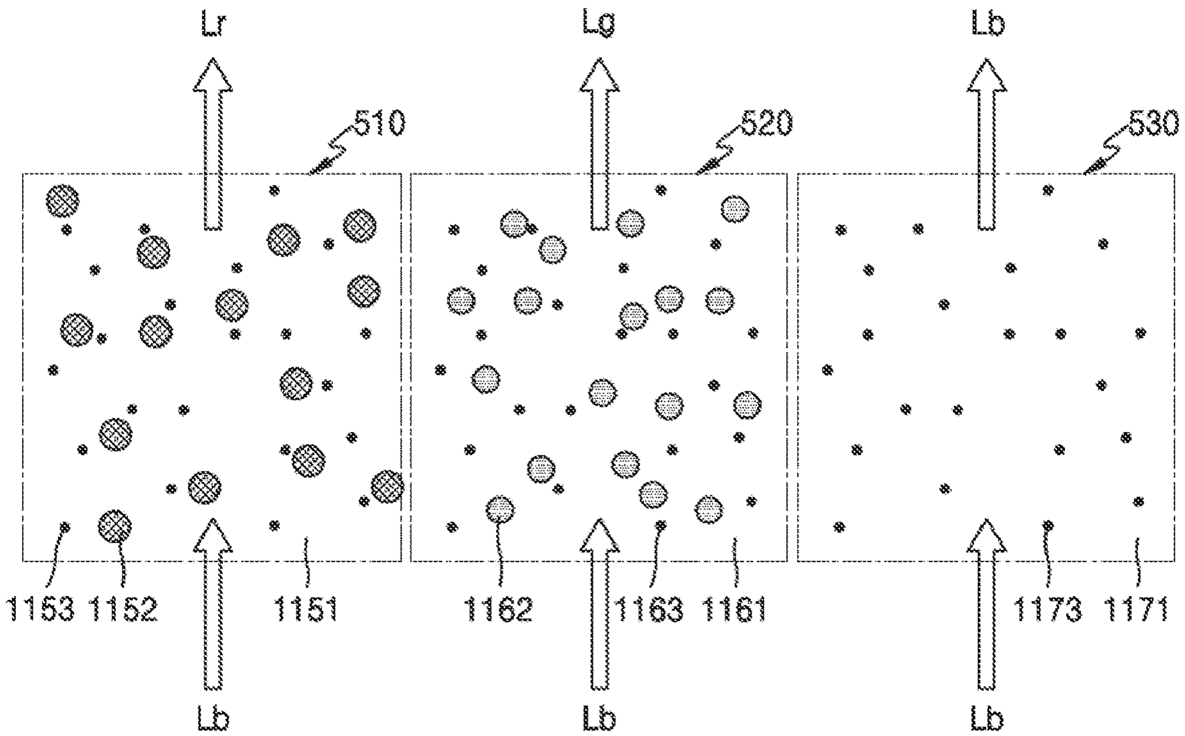
FIG. 3 is a view of respective optical portions of a color conversion-transmissive layer shown in FIG. 2.

FIG. 3 is a view of respective optical portions of the color conversion-transmissive layer 500 shown in FIG. 2.

Referring to FIG. 3, the first color-converter 510 may convert blue light Lb incident thereto into red light Lr. As shown in FIG. 3, the first color-converter 510 may include a first photosensitive polymer 1151, and first quantum dots 1152 and first scattering particles 1153 dispersed in the first photosensitive polymer 1151.

The first quantum dots 1152 may be excited by blue light Lb and may isotropically emit red light Lr having a greater wavelength than the wavelength of the incident blue light Lb. The first photosensitive polymer 1151 may be an organic material having light transmittance. The first scattering particles 1153 may increase a color-converting efficiency by scattering blue light Lb not absorbed by the first quantum dots 1152 and allowing more first quantum dots 1152 to be excited. The first scattering particles 1153 may be, for example, titanium oxide (e.g., $TiO_2$), metal particles, or the like. The first quantum dots 1152 may be one of a Group II-Group VI compound, a Group III-Group V compound, a Group IV-Group VI compound, a Group IV element, a Group IV compound, and a combination thereof.

The second color-converter 520 may convert blue light Lb incident thereto to green light Lg. As shown in FIG. 3, the second color-converter 520 may include a second photosensitive polymer 1161, and second quantum dots 1162 and second scattering particles 1163 dispersed in the second photosensitive polymer 1161.

The second quantum dots 1162 may be excited by blue light Lb and may isotropically emit green light Lg having a greater wavelength than the wavelength of the incident blue light Lb. The second photosensitive polymer 1161 may be an organic material having light transmittance.

The second scattering particles 1163 may increase a color-converting efficiency by scattering blue light Lb not absorbed by the second quantum dots 1162 and allowing more second quantum dots 1162 to be excited. The second scattering particles 1163 may be, for example, titanium oxide (e.g., $TiO_2$), metal particles, or the like. The second quantum dots 1162 may be one of a Group II-Group VI compound, a Group III-Group V compound, a Group IV-Group VI compound, a Group IV element, a Group IV compound, and a combination thereof.

In an embodiment, the first quantum dots 1152 may include the same material as that of the second quantum dots 1162. In such an embodiment, the size of the first quantum dots 1152 may be greater than the size of the second quantum dots 1162.

The transmitter 530 may transmit blue light Lb without converting the blue light Lb incident to the transmitter 530. As shown in FIG. 3, the transmitter 530 may include a third photosensitive polymer 1171 in which third scattering particles 1173 are dispersed. The third photosensitive polymer 1171 may include, for example, an organic material having a light transmittance, such as a silicon resin, epoxy resin, and the like, and may include the same material as the material of the first photosensitive polymer 1151 and the second photosensitive polymer 1161. The third scattering particles 1173 may scatter and emit blue light Lb and may include the same material as those of the first and second scattering particles 1153 and 1163.

Figure 4:
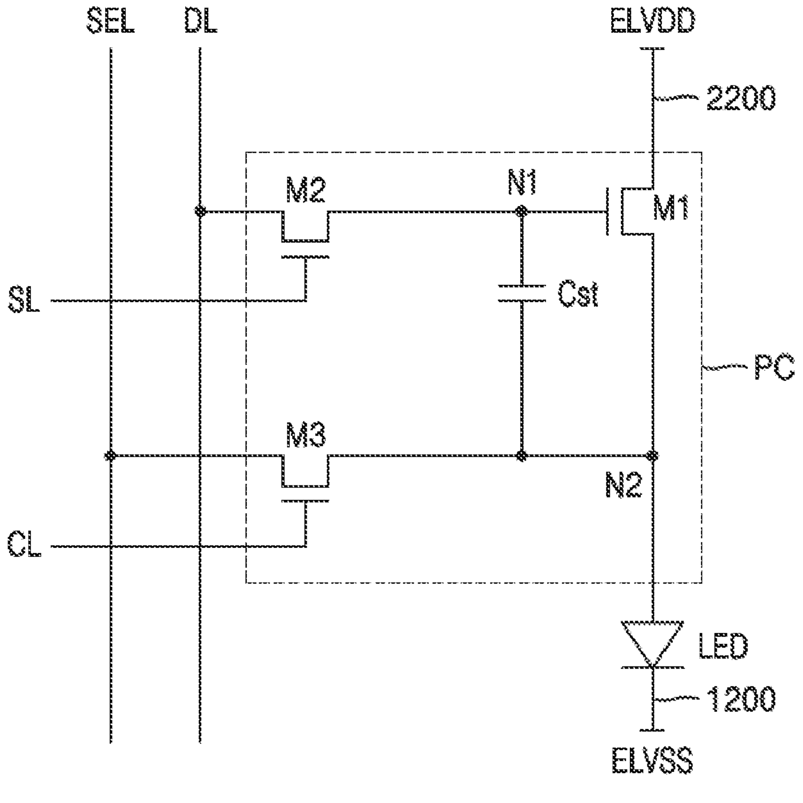
FIG. 4 is a schematic equivalent circuit diagram of a light-emitting diode and a sub-pixel circuit electrically connected to the light-emitting diode of the display apparatus according to an embodiment.

FIG. 4 is a schematic equivalent circuit diagram of a light-emitting diode and a sub-pixel circuit electrically connected to the light-emitting diode of a display apparatus according to an embodiment. The sub-pixel circuit PC shown in FIG. 4 may correspond to each of the first to third sub-pixel circuits PC1, PC2, and PC3 described above with reference to FIG. 2, and the light-emitting diode LED shown in FIG. 4 may correspond to each of the first to third light-emitting diodes LED1, LED2, and LED3 described above with reference to FIG. 2.

Referring to FIG. 4, a first electrode (e.g., an anode) of a light-emitting diode, for example, the light-emitting diode LED may be connected to the sub-pixel circuit PC, and a second electrode (e.g., a cathode) of the light-emitting diode LED may be connected to an auxiliary wiring 1200 configured to provide a common voltage ELVSS. The light-emitting diode LED may emit light at a brightness corresponding to the amount of current supplied from the sub-pixel circuit PC.

The sub-pixel circuit PC may be configured to control the amount of current flowing from a driving voltage ELVDD to the common voltage ELVSS through the light-emitting diode LED according to a data signal. The sub-pixel circuit PC may include a first transistor M1, a second transistor M2, a third transistor M3, and a storage capacitor Cst.

Each of the first transistor M1, the second transistor M2, and the third transistor M3 may be an oxide semiconductor transistor including a semiconductor layer that includes an oxide semiconductor or may be a silicon semiconductor transistor including a semiconductor layer that includes polycrystalline silicon. A first electrode may be one of a source electrode and a drain electrode, and a second electrode may be the other of a source electrode and a drain electrode depending on the type of transistor.

The first electrode of the first transistor M1 may be connected to a driving voltage line 2200 configured to supply a driving voltage ELVDD, and the second electrode of the first transistor M1 may be connected to the first electrode of the light-emitting diode LED. A gate electrode of the first transistor M1 may be connected to a first node N1. The first transistor M1 may be configured to control the amount of current flowing from the driving voltage ELVDD to the light-emitting diode LED according to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. When a scan signal is supplied through the scan line SL, the second transistor M2 may be turned on to electrically connect the data line DL to the first node N1.

The third transistor M3 may be an initialization transistor and/or a sensing transistor. A first electrode of the third transistor M3 may be connected to a second node N2, and a second electrode of the third transistor M3 may be connected to a sensing line SEL. A gate electrode of the third transistor M3 may be connected to a control line CL.

The storage capacitor Cst may be connected between the first node N1 and the second node N2. As an example, a first capacitor electrode of the storage capacitor Cst may be connected to the gate electrode of the first transistor M1, and a second capacitor electrode of the storage capacitor Cst may be connected to the first electrode of the light-emitting diode LED.

Although, in the embodiment shown in FIG. 4, the first transistor M1, the second transistor M2, and the third transistor M3 are shown as being n-channel metal oxide semiconductor (MOS) field-effect transistors (FETs), the present disclosure is not limited thereto. As an example, at least one of the first transistor M1, the second transistor M2, or the third transistor M3 may be a p-channel metal oxide semiconductor (MOS) field-effect transistor (FET).

Although, in the embodiment shown in FIG. 4, three transistors are shown, the present disclosure is not limited thereto. For example, the sub-pixel circuit PC may include four or more transistors.

Figure 5:
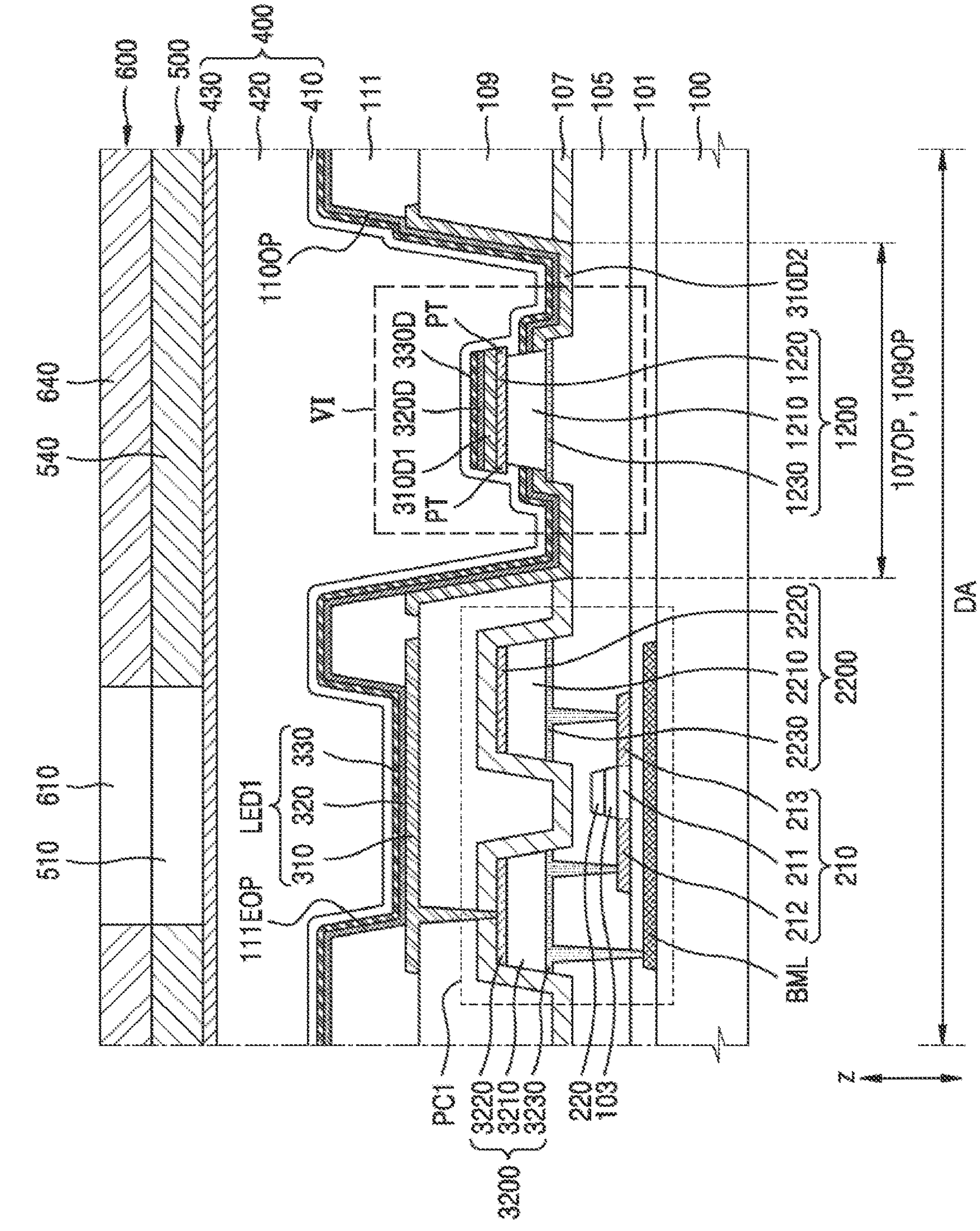
FIG. 5 is a cross-sectional view of a portion of the display apparatus according to an embodiment.
Figure 6:
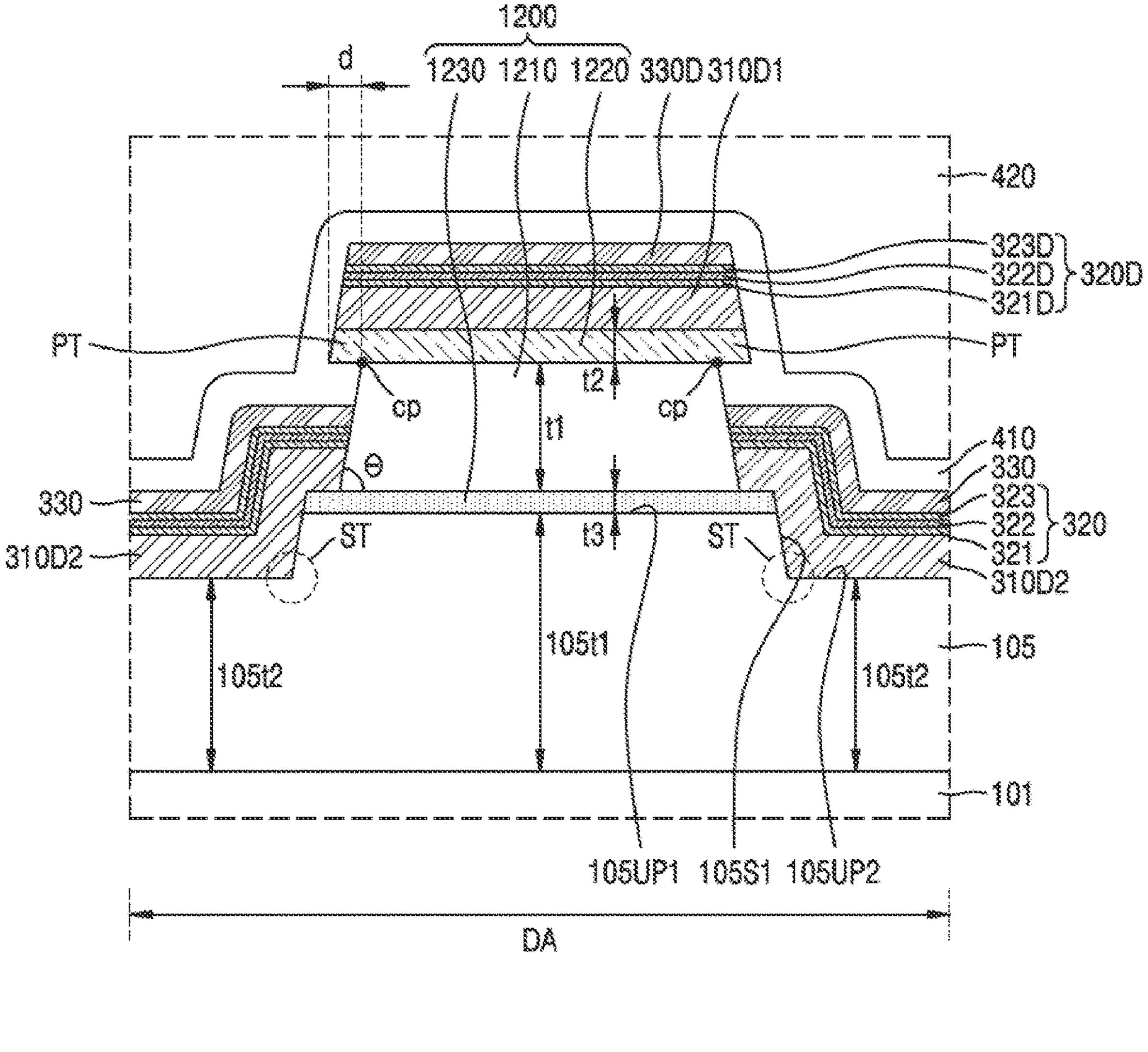
FIG. 6 is an enlarged cross-sectional view of the region VI in FIG. 5.

FIG. 5 is a cross-sectional view of a portion of the display apparatus according to an embodiment, and FIG. 6 is an enlarged cross-sectional view of the region VI in FIG. 5.

Though FIG. 5 shows the first light-emitting diode LED1 from among the plurality of light-emitting diodes of the display apparatus, the second and third light-emitting diodes LED2 and LED3 (see, e.g., FIG. 2) described above with reference to FIG. 2 have the same or substantially similar structures as that of the first light-emitting diode LED1.

Referring to FIG. 5, the first light-emitting diode LED1 is disposed on the substrate 100. The first sub-pixel circuit PC1 is disposed between the substrate 100 and the first light-emitting diode LED1, and the first sub-pixel circuit PC1 is electrically connected to the first light-emitting diode LED1. As described above with reference to FIG. 4, the first sub-pixel circuit PC1 includes the plurality of transistors and the storage capacitor. FIG. 5 shows, as an example, the first transistor M1 shown in FIG. 4.

The substrate 100 may include glass or a polymer resin. The substrate 100 including a polymer resin may be flexible. As an example, the display apparatus including a flexible substrate 100 may be changed in shape; for example, it may be curved, bendable, rollable, or foldable.

A buffer layer 101 may be disposed on the substrate 100 to prevent impurities from penetrating into a transistor, for example, the first transistor M1, from the substrate 100. The buffer layer 101 may include an inorganic insulating material, such as silicon oxide, silicon nitride, and/or silicon oxynitride.

A first semiconductor layer 210 of the first transistor M1 is disposed on the first semiconductor layer 210 of the first transistor M1 is disposed on the buffer layer 101. The first semiconductor layer 210 may include an oxide semiconductor. The oxide semiconductor may include indium gallium zinc oxide (IGZO), zinc tin oxide (ZTO), indium zinc oxide (IZO), and the like. In another embodiment, the first semiconductor layer 210 may include polycrystalline silicon, amorphous silicon, an organic semiconductor, or the like. The first semiconductor layer 210 may have a channel region 211, a first region 212, and a second region 213. The channel region 211 may overlap a gate electrode 220, and the first and second regions 212 and 213 may be respectively disposed on opposite sides of the channel region 211 and doped with impurities or made conductive. One of the first region 212 and the second region 213 may correspond to a source region, and the other may correspond to a drain region.

The gate electrode 220 may overlap the channel region 211 of the first semiconductor layer 210 with a gate insulating layer 103 therebetween. The gate electrode 220 may include a conductive material including molybdenum (Mo), aluminum (Al), copper (Cu), and titanium (Ti) and may have a single layer structure or a multi-layer structure including the above material(s). The gate insulating layer 103 may include an inorganic insulating material, such as silicon oxide, silicon nitride, and/or silicon oxynitride. Although, in the embodiment shown in FIG. 5, the gate insulating layer 103 is patterned together with the gate electrode 220 during the same mask process and does not overlap the first region 212 and the second region 213 of the first semiconductor layer 210, the present disclosure is not limited thereto. In another embodiment, the gate insulating layer 103, similar to the buffer layer 101, may be formed on the entire upper surface of the substrate 100 and may overlap the first region 212 and the second region 213 of the first semiconductor layer 210.

An insulating layer (referred to as an interlayer insulating layer 105 hereinafter) may be disposed on the gate electrode 220. The interlayer insulating layer 105 may include an inorganic insulating material, such as silicon nitride, silicon oxynitride, and/or silicon oxide, and may have a single layer structure or a multi-layer structure including the above material(s). As an example, the interlayer insulating layer 105 may include a stacked structure of a silicon oxide layer and a silicon nitride layer on the silicon oxide layer.

An electrode 3200 may be disposed on the interlayer insulating layer 105 and connected to one of the first region 212 and the second region 213 of the first semiconductor layer 210. In this regard, it is shown in FIG. 5 that the electrode 3200 is connected to the first region 212. However, the electrode 3200 may be connected to a bottom metal layer BML disposed between the substrate 100 and the first semiconductor layer 210. The bottom metal layer BML may be disposed between the substrate 100 and the buffer layer 101. A portion of the bottom metal layer BML may be a lower electrode of the storage capacitor. The storage capacitor may include an upper electrode overlapping the lower electrode. The upper electrode may be formed on the same layer as the gate electrode 220 and may include the same material as a material of the gate electrode 220. The bottom metal layer BML may include at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). At least a portion of the lower metal layer BML may overlap the first semiconductor layer 210.

The driving voltage line 2200 may be disposed on the interlayer insulating layer 105. The driving voltage line 2200 may be formed together with the electrode 3200 and may include the same material as a material of the electrode 3200.

The electrode 3200 and the driving voltage line 2200 may include a plurality of sub-layers. The number of sub-layers and the material included in each of the electrode 3200 and the driving voltage line 2200 may be the same. As an example, the electrode 3200 may include a first sub-layer 3210, a second sub-layer 3220 on the first sub-layer 3210, and a third sub-layer 3230 under the first sub-layer 3210. The driving voltage line 2200 may include a first sub-layer 2210, a second sub-layer 2220 on the first sub-layer 2210, and a third sub-layer 2230 under the first sub-layer 2210. The first sub-layer 3210 of the electrode 3200 may include the same material as a material of the first sub-layer 2210 of the driving voltage line 2200. The second sub-layer 3220 of the electrode 3200 may include the same material as a material of the second sub-layer 2220 of the driving voltage line 2200. The third sub-layer 3230 of the electrode 3200 may include the same material as a material of the third sub-layer 2230 of the driving voltage line 2200.

Although, in the embodiment shown in FIG. 5, each of the electrode 3200 and the driving voltage line 2200 includes three sub-layers, the present disclosure is not limited thereto. In another embodiment, each of the electrode 3200 and the driving voltage line 2200 may have a two-layer structure. For example, the driving voltage line 2200 may have a two-layer structure of the first sub-layer 2210 and the second sub-layer 2220 on the first sub-layer 2210. In other embodiments, the electrode 3200 and the driving voltage line 2200 may further include another sub-layer(s) in addition to the three sub-layers described above.

The auxiliary wiring 1200 arranged in the display area DA may be arranged to be adjacent to the first sub-pixel circuit PC1. The auxiliary wiring 1200 may be disposed on the same layer as the electrode 3200 and/or the driving voltage line 2200. In this regard, it is shown in FIG. 5 that the auxiliary wiring 1200 is disposed on the interlayer insulating layer 105.

The auxiliary wiring 1200 may be formed during the same process as a process of forming the electrode 3200 and/or the driving voltage line 2200 and may include the same material as a material of the electrode 3200 and/or the driving voltage line 2200. The number of sub-layers and the material included in the auxiliary wiring 1200 may be the same as the number of sub-layers and the material included in the electrode 3200 and/or the number of sub-layers and the material included in the driving voltage line 2200.

The auxiliary wiring 1200 may have a stacked structure including a plurality of conductive layers. The auxiliary wiring 1200 may include a first sub-layer 1210, a second sub-layer 1220 on the first sub-layer 1210, and a third sub-layer 1230 under the first sub-layer 1210. Although, in the embodiment shown in FIG. 5, the auxiliary wiring 1200 includes three sub-layers, the present disclosure is not limited thereto. In another embodiment, the auxiliary wiring 1200 may have a two-layer structure including the first sub-layer 1210 and the second sub-layer 1220 on the first sub-layer 1210. In other embodiments, the auxiliary wiring 1200 may further include another sub-layer(s) in addition to the three sub-layers described above.

The first sub-layer 1210 of the auxiliary wiring 1200 may be a sub-layer occupying (or forming) most of the auxiliary wiring 1200. When the first sub-layer 1210 occupies most of the auxiliary wiring 1200, a thickness t1 of the first sub-layer 1210 may be about 50% or more of the entire thickness of the auxiliary wiring 1200. In an embodiment, the thickness t1 (see, e.g., FIG. 6) of the first sub-layer 1210 may be about 60% or more or about 70% or more of the entire thickness of the auxiliary wiring 1200. The thickness t1 of the first sub-layer 1210 may be greater than each of a thickness t2 (see, e.g., FIG. 6) of the second sub-layer 1220 and a thickness t3 (see, e.g., FIG. 6) of the third sub-layer 1230. In an embodiment, the thickness t1 of the first sub-layer 1210 may be in a range of about 4000 Å to about 8000 Å. The thickness t2 of the second sub-layer 1220 may be in a range of about 100 Å to about 500 Å. The thickness t3 of the third sub-layer 1230 may be equal to or less than the thickness t2 of the second sub-layer 1220. The thickness t3 of the third sub-layer 1230 may be in a range of about 100 Å to about 200 Å.

The first sub-layer 1210 of the auxiliary wiring 1200, the first sub-layer 2210 of the driving voltage line 2200, and the first sub-layer 3210 of the electrode 3200 may each have the same material and the same thickness. The first sub-layer 1210 of the auxiliary wiring 1200, the first sub-layer 2210 of the driving voltage line 2200, and the first sub-layer 3210 of the electrode 3200 may each include at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo), taking into account conductivity and the like.

The second sub-layer 1220 of the auxiliary wiring 1200, the second sub-layer 2220 of the driving voltage line 2200, and the second sub-layer 3220 of the electrode 3200 may each have the same material and the same thickness. The second sub-layer 1220 of the auxiliary wiring 1200, the second sub-layer 2220 of the driving voltage line 2200, and the second sub-layer 3220 of the electrode 3200 may respectively protect the first sub-layer 1210 of the auxiliary wiring 1200, the first sub-layer 2210 of the driving voltage line 2200, and the first sub-layer 3210 of the electrode 3200. The second sub-layer 1220 of the auxiliary wiring 1200, the second sub-layer 2220 of the driving voltage line 2200, and the second sub-layer 3220 of the electrode 3200 may respectively include materials different from the first sub-layer 1210 of the auxiliary wiring 1200, the first sub-layer 2210 of the driving voltage line 2200, and the first sub-layer 3210 of the electrode 3200.

In an embodiment, the second sub-layer 1220 of the auxiliary wiring 1200, the second sub-layer 2220 of the driving voltage line 2200, and the second sub-layer 3220 of the electrode 3200 may each include a transparent conductive oxide (TCO), such as indium tin oxide (ITO). In another embodiment, the second sub-layer 1220 of the auxiliary wiring 1200, the second sub-layer 2220 of the driving voltage line 2200, and the second sub-layer 3220 of the electrode 3200 may each include at least one selected from titanium (Ti), molybdenum (Mo), and tungsten (W). In another embodiment, the second sub-layer 1220 of the auxiliary wiring 1200, the second sub-layer 2220 of the driving voltage line 2200, and the second sub-layer 3220 of the electrode 3200 may each have a multi-layer structure including a metal layer and a transparent conductive oxide layer.

The third sub-layer 1230 of the auxiliary wiring 1200, the third sub-layer 2230 of the driving voltage line 2200, and the third sub-layer 3230 of the electrode 3200 may each have the same material and the same thickness. The third sub-layer 1230 of the auxiliary wiring 1200, the third sub-layer 2230 of the driving voltage line 2200, and the third sub-layer 3230 of the electrode 3200 may each increase adhesive force between the first sub-layer 1210 of the auxiliary wiring 1200, the first sub-layer 2210 of the driving voltage line 2200, the first sub-layer 3210 of the electrode 3200, and the insulating layer (e.g., the interlayer insulating layer 105) thereunder. The third sub-layer 1230 of the auxiliary wiring 1200, the third sub-layer 2230 of the driving voltage line 2200, and the third sub-layer 3230 of the electrode 3200 may respectively include materials different from the first sub-layer 1210 of the auxiliary wiring 1200, the first sub-layer 2210 of the driving voltage line 2200, and the first sub-layer 3210 of the electrode 3200.

The third sub-layer 1230 of the auxiliary wiring 1200, the third sub-layer 2230 of the driving voltage line 2200, and the third sub-layer 3230 of the electrode 3200 may each be metal layers including a metal, such as titanium (Ti), or transparent conductive oxide layers including transparent conductive oxides (TCO), such as gallium zinc oxide (GZO) and/or indium zinc oxide (IZO), and the above-described transparent conductive oxide may be amorphous or crystalline.

The insulating layer under the auxiliary wiring 1200, for example, the interlayer insulating layer 105, may have a step difference structure. As an example, as shown in FIG. 6, an upper surface 105UP1 of a first portion of the interlayer insulating layer 105 directly contacting the auxiliary wiring 1200 may form a step difference ST with an upper surface 105UP2 of a second portion of the interlayer insulating layer 105 adjacent to the auxiliary wiring 1200.

The step difference ST may be formed when a portion of the interlayer insulating layer 105 not overlapping the auxiliary wiring 1200 is etched during a process of forming the auxiliary wiring 1200. A first thickness 105*t*1 of the first portion of the interlayer insulating layer 105 overlapping the auxiliary wiring 1200 may be greater than a second thickness 105*t*2 of the second portion of the interlayer insulating layer 105 not overlapping the auxiliary wiring 1200 and arranged around (e.g., around a periphery of) the auxiliary wiring 1200. The width of the upper surface 105UP1 of the first portion of the interlayer insulating layer 105 having the first thickness 105*t*1 may be substantially the same as the width of the bottom surface of the auxiliary wiring 1200, for example, the bottom surface of the third sub-layer 1230.

The upper surface 105UP1 of the first portion of the interlayer insulating layer 105 directly contacting the bottom surface of the auxiliary wiring 1200 may be located on a level different from the upper surface 105UP2 of the second portion of the interlayer insulating layer 105 adjacent to the auxiliary wiring 1200 that does not contact the bottom surface of the auxiliary wiring 1200. As referred to herein, when the levels are different, it may represent that vertical distances in a z direction from the upper surface of the substrate 100 are different from each other. The upper surface 105UP1 of the first portion of the interlayer insulating layer 105 may be connected to the upper surface 105UP2 of the second portion of the interlayer insulating layer 105 by a lateral surface 105S1 of the interlayer insulating layer 105, and the lateral surface 105S1 of the interlayer insulating layer 105 may be located on substantially the same plane as the lateral surface of the lowermost layer of the auxiliary wiring 1200, for example, the third sub-layer 1230. For example, the lateral surface 105S1 of the interlayer insulating layer 105 may be continuously connected to the lateral surface of the third sub-layer 1230 of the auxiliary wiring 1200 without forming a step difference with respect to the lateral surface of the third sub-layer 1230 of the auxiliary wiring 1200.

Similarly, a portion of the interlayer insulating layer 105 under the driving voltage line 2200 and a portion of the interlayer insulating layer 105 under the electrode 3200 may each have a step difference structure. The thickness of a portion of the interlayer insulating layer 105 overlapping the driving voltage line 2200 may be greater than the thickness of another portion of the interlayer insulating layer 105 not overlapping the driving voltage line 2200 and arranged around the driving voltage line 2200. A portion of the interlayer insulating layer 105 overlapping the driving voltage line 2200 may form a step difference with respect to another portion of the interlayer insulating layer 105 arranged around the driving voltage line 2200.

The thickness of a portion of the interlayer insulating layer 105 overlapping the electrode 3200 may be greater than the thickness of another portion of the interlayer insulating layer 105 not overlapping the electrode 3200 and arranged around the electrode 3200. A portion of the interlayer insulating layer 105 overlapping the electrode 3200 may form a step difference with respect to another portion of the interlayer insulating layer 105 arranged around the electrode 3200.

At least one insulating layer may be disposed on the driving voltage line 2200 and the electrode 3200. In this regard, it is shown in FIG. 5 that the at least one insulating layer includes an inorganic protective layer 107 and an organic insulating layer 109.

The inorganic protective layer 107 may be disposed on the driving voltage line 2200 and the electrode 3200, and the organic insulating layer 109 may be disposed on the inorganic protective layer 107. The inorganic protective layer 107 may include an inorganic insulating material, such as silicon nitride, silicon oxynitride, and/or silicon oxide, and may have a single layer structure or a multi-layer structure including the above material(s). The organic insulating layer 109 may include an organic insulating material, such as acryl, benzocyclobutene (BCB), polyimide, or hexamethyldisiloxane (HMDSO).

The cross-sectional shape of the driving voltage line 2200 and/or the electrode 3200 may be different from the cross-sectional shape of the auxiliary wiring 1200. As an example, the auxiliary wiring 1200 has a cross-sectional structure having a tip PT while the driving voltage line 2200 and/or the electrode 3200 may have a cross-sectional structure of an approximately trapezoidal shape (e.g., an approximately equilateral trapezoidal shape) with an upwardly tapered slope.

The inorganic protective layer 107 may overlap at least a portion of the upper surface and the lateral surface of the driving voltage line 2200 and may overlap at least a portion of the upper surface and the lateral surface of the electrode 3200. The organic insulating layer 109 may overlap at least a portion of the upper surface and the lateral surface of the driving voltage line 2200 and may overlap at least a portion of the upper surface and the lateral surface of the electrode 3200.

The inorganic protective layer 107 and the organic insulating layer 109 may respectively have openings 107OP and 109OP overlapping the auxiliary wiring 1200. The widths of the openings 107OP and 109OP in the inorganic protective layer 107 and the organic insulating layer 109 may be greater than the width of the auxiliary wiring 1200.

The first electrode 310 of the first light-emitting diode LED1 may include a transparent conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 310 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first electrode 310 may further include a layer on/under the reflective layer, and the layer includes ITO, IZO, ZnO, or $In_2O_3$. As an example, the first electrode 310 may have a three-layer structure including an ITO layer, an Ag layer, and an ITO layer.

A bank layer 111 may be disposed on a first electrode 310 and may cover the edges of the first electrode 310. The bank layer 111 has an opening 111EOP (referred to as an emission opening, hereinafter) overlapping a portion of the first electrode 310. The emission opening 111EOP may expose the central portion of the first electrode 310. The bank layer 111 may include an organic material. The bank layer 111 may have an opening 110OP overlapping the openings 107OP and 109OP in the inorganic protective layer 107 and the organic insulating layer 109.

An intermediate layer 320 may contact the first electrode 310 through the emission opening 111EOP. Referring to FIG. 6, the intermediate layer 320 may include an emission layer 322 and a functional layer located under and/or on the emission layer 322. In this regard, it is shown in FIG. 6 that the intermediate layer 320 includes a first functional layer 321 and a second functional layer 323, with the first functional layer 321 being disposed under the emission layer 322 and the second functional layer 323 being disposed on the emission layer 322.

The intermediate layer 320 may have a single stack structure including a single emission layer or a tandem structure, which is a multi-stack structure including a plurality of emission layers. When the intermediate layer 320 has the tandem structure, a charge generation layer (CGL) may be disposed between the plurality of stacks.

The first functional layer 321 may include a single layer or may have a multi-layer structure. The first functional layer 321 may include a hole injection layer (HIL) and/or a hole transport layer (HTL). The emission layer 322 may include a polymer organic material or a low-molecular weight organic material configured to emit light having a color (e.g., a preset color). The second functional layer 323 may include an electron transport layer (ETL) and/or an electron injection layer (EIL).

The second electrode 330 may include a conductive material having a low work function. As an example, the second electrode 330 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. In other embodiments, the second electrode 330 may further include a layer on the (semi) transparent layer, and the layer includes ITO, IZO, ZnO, or $In_2O_3$.

Different from the first electrode 310, the intermediate layer 320 and the second electrode 330 may be deposited by using a mask having an opening corresponding to the display area DA. Accordingly, the intermediate layer 320 may be formed in the entire display area DA. The intermediate layer 320 may be disconnected or separated around the auxiliary wiring 1200 due to the shape of the auxiliary wiring 1200. Similarly, the second electrode 330 may be formed in the entire display area DA and may be disconnected or separated around the auxiliary wiring 1200 due to the shape of the auxiliary wiring 1200. Portions of the second electrode 330 located on two opposite sides around the auxiliary wiring 1200 may contact the lateral surface of the auxiliary wiring 1200. In an embodiment, the second electrode 330 may face the first electrode 310.

As shown in FIGS. 5 and 6, the width of the second sub-layer 1220 of the auxiliary wiring 1200 may be greater than the width of the first sub-layer 1210. In other words, the second sub-layer 1220 may include the tip PT protruding from a position where the lateral surface of the first sub-layer 1210 meets the bottom surface of the second sub-layer 1220, for example, in a cross-sectional view, the second sub-layer 1220 may include the tip PT protruding in a width direction of the second sub-layer 1220 from a point cp where the lateral surface of the first sub-layer 1210 meets the bottom surface of the second sub-layer 1220. The tip PT has a distance (or a width) "d" from the position or point cp to an edge of the second sub-layer 1220. As an example, the second sub-layer 1220 may include a pair of tips PT disposed on two opposite sides of the second sub-layer 1220 in the width direction. In other words, the auxiliary wiring 1200 may include a pair of tips PT protruding in the width direction and respectively disposed on two opposite sides of the auxiliary wiring 1200.

During a deposition process of forming the intermediate layer 320 and the second electrode 330, the deposition material may progress in a direction (e.g., a z direction) perpendicular to the substrate 100 and a direction oblique thereto. Accordingly, portions of the intermediate layer 320 located on two opposite sides of the auxiliary wiring 1200 may directly contact the lateral surface of the first sub-layer 1210. Portions of the second electrode 330 located on two opposite sides of the auxiliary wiring 1200 may directly contact the lateral surface of the first sub-layer 1210.

Because the lateral surface of the first sub-layer 1210 of the auxiliary wiring 1200 has an inclined surface tapered upwardly, a contact area between the second electrode 330 and the lateral surface of the first sub-layer 1210 may be increased. In an embodiment, an angle θ (see, e.g., FIG. 6) between the inclined surface tapered upwardly in the lateral surface of the first sub-layer 1210 and a bottom surface of the first sub-layer 1210 may be in a range of about 40° to about 70°.

A material for forming the intermediate layer 320 and a deposition material for forming the second electrode 330 may be deposited also on the auxiliary wiring 1200. In this regard, FIGS. 5 and 6 show a dummy intermediate layer 320D and a dummy electrode 330D on the auxiliary wiring 1200. When the intermediate layer 320 includes the first function layer 321, the emission layer 322, and the second functional layer 323 as shown in FIG. 6, the dummy intermediate layer 320D may include a first dummy functional layer 321D, a dummy emission layer 322D, and a second dummy functional layer 323D. The dummy intermediate layer 320D and the dummy electrode 330D may each be separated from the intermediate layer 320 and the second electrode 330 contacting the lateral surface of the auxiliary wiring 1200 due to the structure of the auxiliary wiring 1200 having the tip PT.

A first conductive material portion 310D1 and a second conductive material portion 310D2 may be respectively disposed on the upper surface and the lateral surface of the auxiliary wiring 1200. The first conductive material portion 310D1 may be disposed on the upper surface of the auxiliary wiring 1200. The first conductive material portion 310D1 may be disposed under the dummy intermediate layer 320D and may directly contact the upper surface of the auxiliary wiring 1200. The second conductive material portion 310D2 may be disposed under a portion of the intermediate layer 320 contacting the lateral surface of the auxiliary wiring 1200 and may be disposed to be adjacent to the auxiliary wiring 1200. As an example, the second conductive material portion 310D2 may directly contact a portion of the lateral surface of the auxiliary wiring 1200. As an example, as shown in FIGS. 5 and 6, the second conductive material portion 310D2 may contact a portion of the upper surface 105UP2 of the second portion of the interlayer insulating layer 105, the lateral surface 105S1 corresponding to the structure of the step difference ST of the interlayer insulating layer 105, a portion of the lateral surface and the upper surface of the third sub-layer 1230 of the auxiliary wiring 1200, and a portion of the lateral surface of the first sub-layer 1210 of the auxiliary wiring 1200.

The first conductive material portion 310D1 and the second conductive material portion 310D2 may include the same material as a material of the first electrode 310 of the first light-emitting diode LED1. The first conductive material portion 310D1 and the second conductive material portion 310D2 may be formed together (e.g., may be formed at the same time) during a process of forming the first electrode 310 of the first light-emitting diode LED1. The first conductive material portion 310D1 may be separated from the second conductive material portion 310D2 due to the structure of the tip PT of the auxiliary wiring 1200.

A light-emitting diode, for example, the first light-emitting diode LED1, is covered by an encapsulation layer 400, and the light-emitting diode includes a multi-layered structure of the first electrode 310, the intermediate layer 320, and the second electrode 330. The encapsulation layer 400 may include at least one inorganic encapsulation layer and at least one organic encapsulation layer. In an embodiment, the encapsulation layer 400 may include a first inorganic encapsulation layer 410, an organic encapsulation layer 420, and a second inorganic encapsulation layer 430, with the organic encapsulation layer 420 being on the first inorganic encapsulation layer 410 and the second inorganic encapsulation layer 430 being on the organic encapsulation layer 420.

The first and second inorganic encapsulation layers 410 and 430 may each include at least one inorganic insulating material. The inorganic insulating material may include aluminum oxide, tantalum oxide, hafnium oxide, zinc oxide, silicon oxide, silicon nitride, and/or silicon oxynitride. The first and second inorganic encapsulation layers 410 and 430 may be formed by chemical vapor deposition. Because the first inorganic encapsulation layer 410 has relatively excellent step coverage, the first inorganic encapsulation layer 410 may continuously cover the auxiliary wiring 1200 even though the auxiliary wiring 1200 has a shape of the tip PT. As an example, the first inorganic encapsulation layer 410 may continuously extend to overlap the upper surface and the lateral surface of the dummy electrode 330D disposed on the auxiliary wiring 1200, the lateral surface of the dummy intermediate layer 320D, the lateral surface of the first conductive material portion 310D1, the lateral surface and the bottom surface of the tip PT, the lateral surface of the first sub-layer 1210, and the upper surface of the second electrode 330 contacting the lateral surface of the first sub-layer 1210.

The organic encapsulation layer 420 may include a polymer-based material. The polymer-based material may include an acryl-based resin, an epoxy-based resin, polyimide, and polyethylene. An acryl-based resin may include, for example, polymethyl methacrylate, polyacrylic acid, and the like.

A color conversion-transmissive layer 500 and a color layer 600 may be disposed on the encapsulation layer 400. In this regard, it is shown in FIG. 5 that a first color-converter 510 of the color conversion-transmissive layer 500 is arranged to overlap the first light-emitting diode LED1, and a first color filter 610 of the color layer 600 is arranged to overlap the first light-emitting diode LED1. The first color-converter 510 and the first color filter 610 may be respectively surrounded (e.g., surrounded in a plane view) by light-blocking portions 540 and 640. In this regard, FIG. 5 shows the light-blocking portions 540 and 640 disposed on opposite sides of each of the first color-converter 510 and the first color filter 610. The light-blocking portions 540 and 640 may include a light-blocking material, such as a black matrix, and the auxiliary wiring 1200 may overlap the light-blocking portions 540 and 640.

FIGS. 7 to 14 are cross-sectional views showing steps of a process of manufacturing the display apparatus according to an embodiment.

Figure 7:
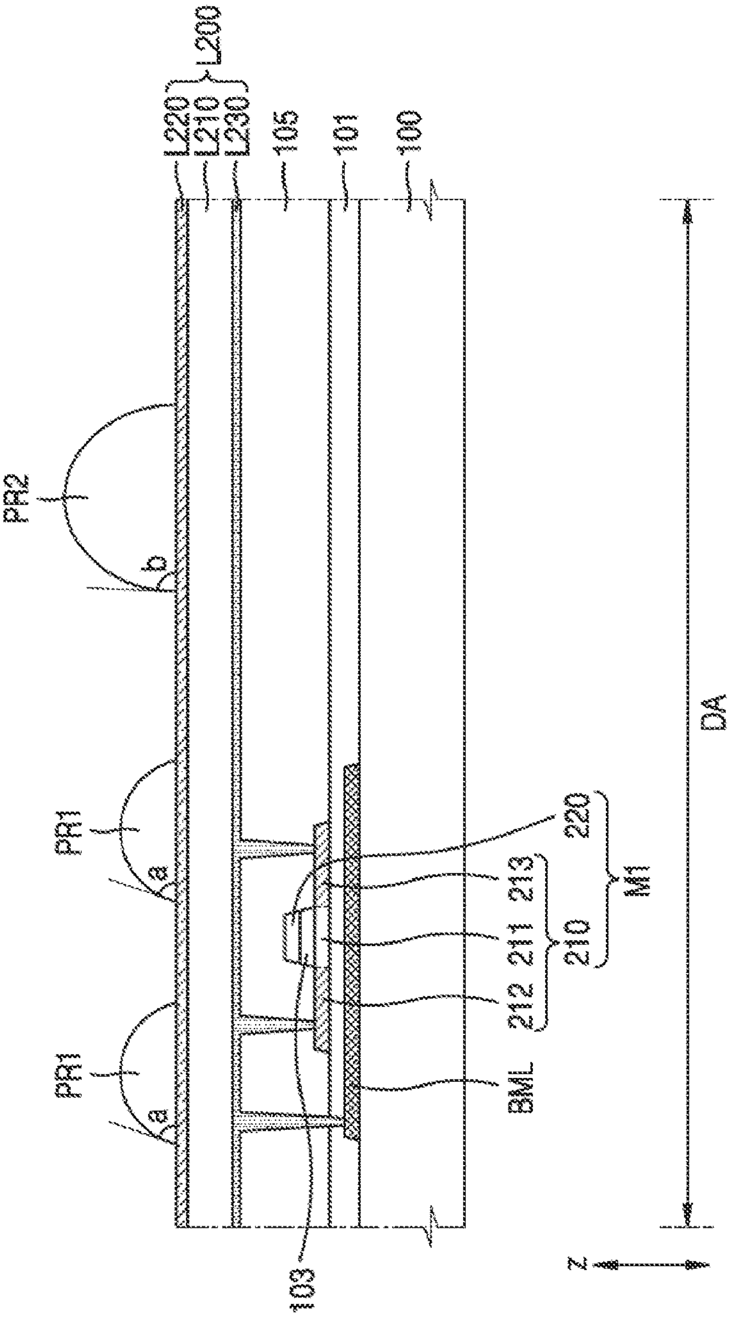
FIGS. 7 to 14 are cross-sectional views showing steps of a process of manufacturing a display apparatus according to an embodiment.

Referring to FIG. 7, a transistor may be formed on the substrate 100, and the transistor includes the first semiconductor layer 210 and the gate electrode 220. In the embodiment shown in FIG. 7, a first transistor M1 including the first semiconductor layer 210 and the gate electrode 220 is shown as an example.

Before the first semiconductor layer 210 is formed, the bottom metal layer BML and the buffer layer 101 may be formed on the substrate 100. The materials of the bottom metal layer BML and the buffer layer 201 are the same as those described above with reference to FIG. 5.

The first semiconductor layer 210 may be arranged to overlap the bottom metal layer BML, and the gate insulating layer 103 may be formed between the first semiconductor layer 210 and the gate electrode 220. The gate insulating layer 103 may be patterned together during the same mask process as a mask process of forming the gate electrode 220. In another embodiment, the gate insulating layer 103 may be formed to entirely overlap the first semiconductor layer 210. In such an embodiment, the gate insulating layer 103 may not be patterned during the mask process of forming the gate electrode 220.

The first semiconductor layer 210 may have a channel region 211, a first region 212, and a second region 213. The channel region 211 overlaps a gate electrode 220, and the first and second regions 212 and 213 are disposed on opposite sides of the channel region 211 and doped with impurities or made conductive. The interlayer insulating layer 105 may be formed on the gate electrode 220.

The interlayer insulating layer 105 may include an inorganic insulating material, such as silicon nitride, silicon oxynitride, and/or silicon oxide, and may have a single layer structure or a multi-layer structure including the above material(s). The interlayer insulating layer 105 may have contact holes (or contact openings) exposing a portion of the first semiconductor layer 210 and a portion of the bottom metal layer BML.

Next, a conductive stack L200 including a plurality of sub-layers is formed on the interlayer insulating layer 105. In an embodiment, the conductive stack L200 may include a first sub-layer L210 and a second sub-layer L220 on the first sub-layer L210. In another embodiment, as shown in FIG. 7, the conductive stack L200 may include the first sub-layer L210, the second sub-layer L220 on the first sub-layer L210, and a third sub-layer L230 under the first sub-layer L210.

The first sub-layer L210 may include at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

The second sub-layer L220 may include a transparent conductive oxide (TCO), such as indium tin oxide (ITO). In another embodiment, the second sub-layer L220 may include at least one selected from titanium (Ti), molybdenum (Mo), and tungsten (W). In another embodiment, the second sub-layer L220 may have a multi-layer structure including a metal layer and a transparent conductive oxide layer.

The third sub-layer L230 may be a metal layer including a metal, such as titanium (Ti), or a transparent conductive oxide layer including a transparent conductive oxide (TCO), such as gallium zinc oxide (GZO) and/or indium zinc oxide (IZO). The above-mentioned transparent conductive oxide may be amorphous or crystalline.

The thickness of the first sub-layer L210 may be greater than the thickness of the second sub-layer L220 and the thickness of the third sub-layer L230. In an embodiment, the thickness of the first sub-layer L210 may be in a range of about 4000 Å to about 8000 Å. The thickness of the second sub-layer L220 may be in a range of about 100 Å to about 500 Å. The thickness of the third sub-layer may be equal to or less than the thickness of the second sub-layer L220. As an example, the thickness of the third sub-layer L230 may be in a range of about 100 Å to about 200 Å.

After the conductive stack L200 is formed, first photoresists PR1 and second photoresists PR2 are formed on the conductive stack L200. The first photoresists PR1 and the second photoresists PR2 may be formed by forming a photosensitive material layer on the conductive stack L200 and exposing and developing portions of the photosensitive material layer. The amount of exposure of the portions of the photosensitive material layer corresponding to the first photoresists PR1 and the second photoresists PR2 may be different from each other. As an example, the first photoresist PR1 may be formed by exposing and developing a first portion of the photosensitive material layer through a half-tone region of a mask, and the second photoresist PR2 may be formed by exposing and developing a second portion of the photosensitive material layer through a full-tone region of the mask.

The height of the first photoresist PR1 may be different from the height of the second photoresist PR2. The height of the first photoresist PR1 may be less than the height of the second photoresist PR2. The lateral slope angle a of the first photoresist PR1 may be different from the lateral slope angle b of the second photoresist PR2. A lateral slope angle a of the first photoresist PR1 may be less than a lateral slope angle b of the second photoresist PR2.

Figure 8:
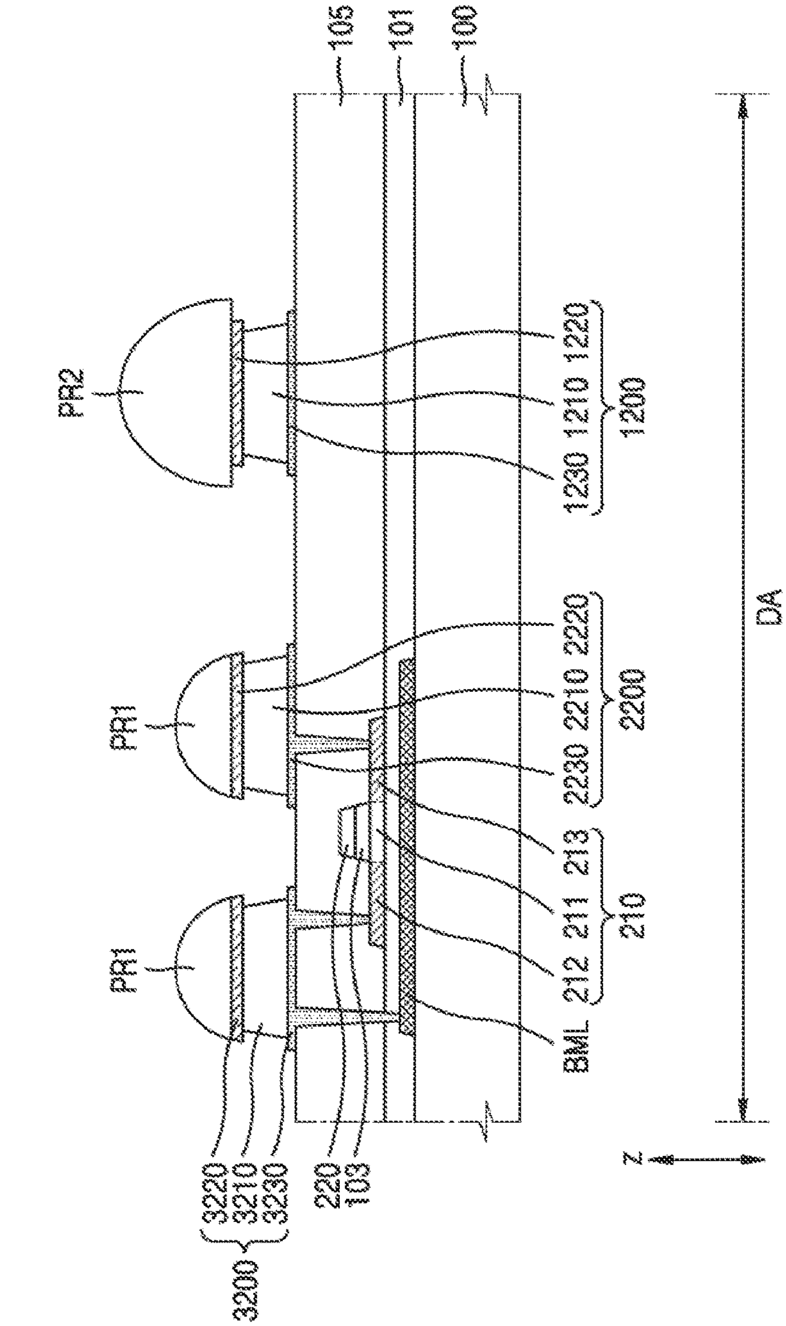

Referring to FIGS. 7 and 8, the electrode 3200, the driving voltage line 2200, and the auxiliary wiring 1200 may be formed by etching the conductive stack L200 by using the first photoresists PR1 and the second photoresists PR2 as masks. Because the electrode 3200, the driving voltage line 2200, and the auxiliary wiring 1200 are formed by etching the conductive stack L200 including a plurality of sub-layers, for example, the first to third sub-layers L210, L220, and L230, the electrode 3200, the driving voltage line 2200, and the auxiliary wiring 1200 may each have a structure including the plurality of sub-layers. As an example, the electrode 3200 may include first to third sub-layers 3210, 3220, and 3230, the driving voltage line 2200 may include first to third sub-layers 2210, 2220, and 2230, and the auxiliary wiring 1200 may include first to third sub-layers 1210, 1220, and 1230.

The first sub-layers 3210, 2210, and 1210 respectively of the electrode 3200, the driving voltage line 2200, and the auxiliary wiring 1200 may include the same material as the material of the first sub-layer L210 of the conductive stack L200, and the first sub-layers 3210, 2210, and 1210 respectively of the electrode 3200, the driving voltage line 2200, and the auxiliary wiring 1200 may each have the same thickness as the thickness of the first sub-layer L210 of the conductive stack L200. The second sub-layers 3220, 2220, and 1220 respectively of the electrode 3200, the driving voltage line 2200, and the auxiliary wiring 1200 may include the same material as the material of the second sub-layer L220 of the conductive stack L200, and the second sub-layers 3220, 2220, and 1220 respectively of the electrode 3200, the driving voltage line 2200, and the auxiliary wiring 1200 may each have the same thickness as the thickness of the second sub-layer L220 of the conductive stack L200. The second sub-layers 3230, 2230, and 1230 respectively of the electrode 3200, the driving voltage line 2200, and the auxiliary wiring 1200 may include the same material as the material of the third sub-layer L230 of the conductive stack L200, and the third sub-layers 3230, 2230, and 1230 respectively of the electrode 3200, the driving voltage line 2200, and the auxiliary wiring 1200 may each have the same thickness as the thickness of the third sub-layer L230 of the conductive stack L200.

The conductive stack L200 may be etched by using wet etching. Because the first sub-layer L210 and the second sub-layer L220 of the conductive stack L200 include different etching selectivities, the etched amounts of the first sub-layer L210 and the second sub-layer L220 of the conductive stack L200 may be different from each other.

The first sub-layer L210 may be excessively etched compared to the second sub-layer L220. Accordingly, the auxiliary wiring 1200 may include the second sub-layer 1220 that extends further in the width direction than the first sub-layer 1210. In an embodiment, the third sub-layer 1230 of the auxiliary wiring 1200 may also further extend in the width direction than the first sub-layer 1210. As an example, one end portion (or edge portion) of the second sub-layer 1220 may have a tip structure further extending in the width direction from a point at which the bottom surface of the second sub-layer 1220 meets the lateral surface of the first sub-layer 1210. Similarly, one end portion (or edge portion) of the third sub-layer 1230 of the auxiliary wiring 1200 may have a tip structure further extending in the width direction from a point at which the upper surface of the third sub-layer 1230 meets the lateral surface of the first sub-layer 1210. In the embodiment shown in FIG. 8, tip structures are respectively formed on two opposite sides of the auxiliary wiring 1200.

The driving voltage line 2200 may include the first to third sub-layers 2210, 2220, and 2230, and the second sub-layer 2220 of the driving voltage line 2200 may also have a tip structure. Similarly, the electrode 3200 may include the first to third sub-layers 3210, 3220, and 3230, and the second sub-layer 3220 of the electrode 3200 may also have a tip structure. In the embodiment shown in FIG. 8, tip structures are respectively formed on two opposite sides of each of the driving voltage line 2200 and the electrode 3200.

After the auxiliary wiring 1200, the driving voltage line 2200, and the electrode 3200 are formed by etching the conductive stack L200 by using the first and second photoresists PR1 and PR2 as masks as described with reference to FIG. 8, a process of trimming two opposite sides of at least the driving voltage line 2200 and the electrode 3200 may be performed.

Figure 9:
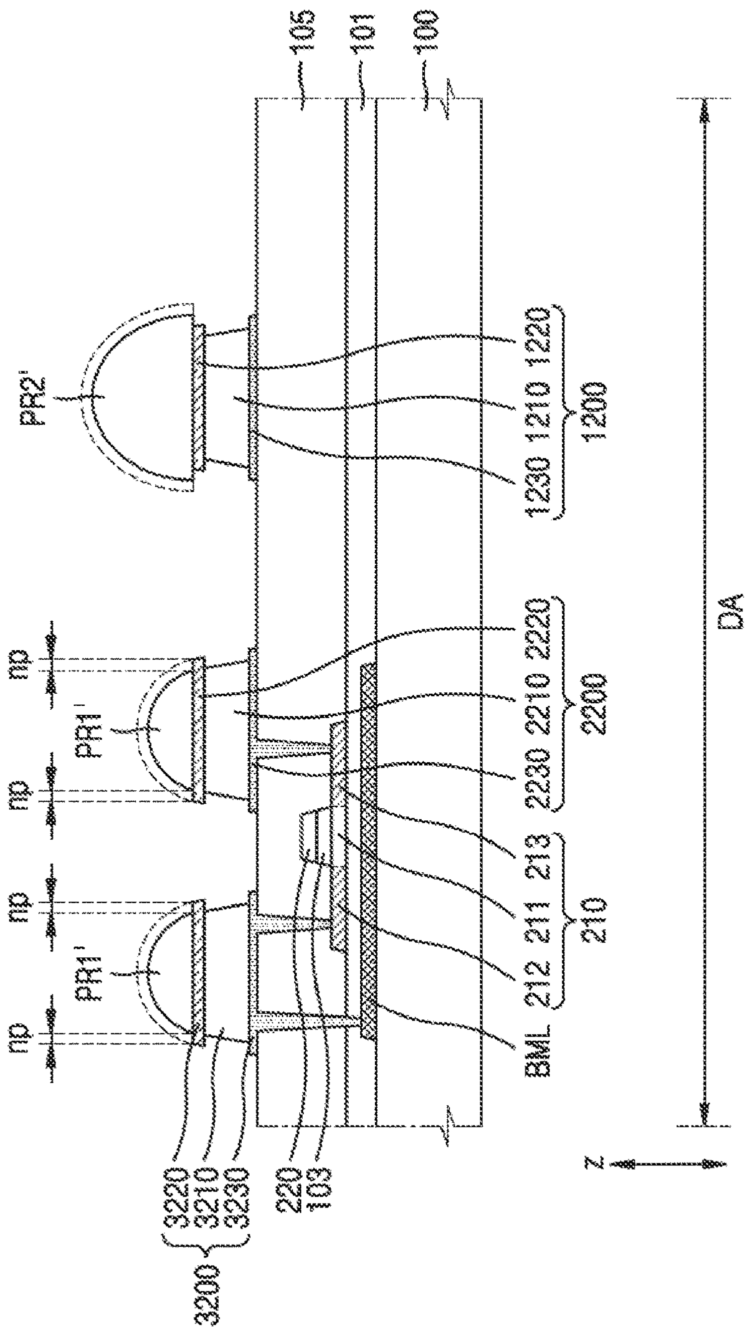

As an example, as shown in FIG. 9, after the first and second photoresists PR1 and PR2 are ashed (e.g., dry-ashed), the end portion (edge portion) of the driving voltage line 2200 and the electrode 3200 may be removed using an ashed first photoresist PR1'.

Figure 10:
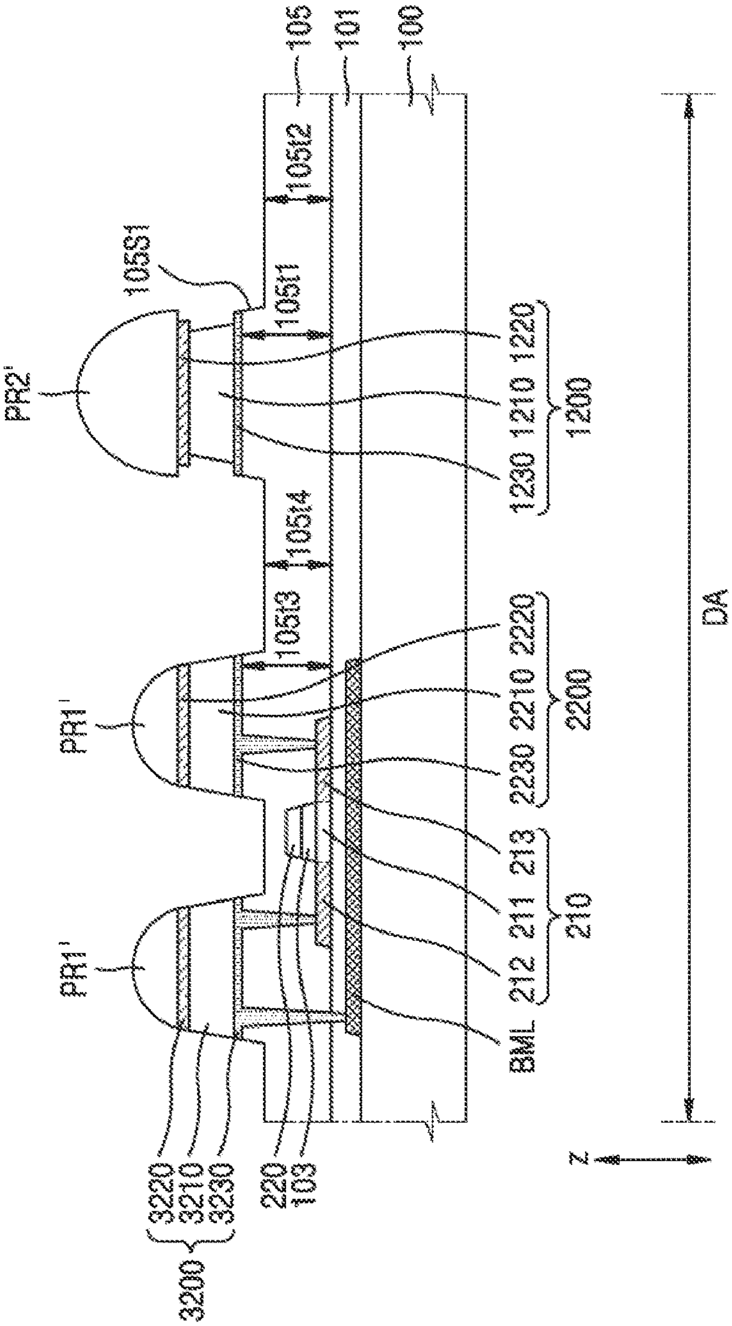

The ashed first photoresist PR1' may have a reduced width compared to the first photoresist PR1, and thus, an end portion (or edge portion) np of each of the driving voltage line 2200 and the electrode 3200 may be exposed. The end portion (or edge portion) np of each of the driving voltage line 2200 and the electrode 3200 that is exposed without overlapping the ashed first photoresist PR1' may be removed through the etching process, for example, drying etching. A lateral surface of each of the driving voltage line 2200 and the electrode 3200 with the end portion (or edge portion) np removed may have a sloped surface that is tapered upwardly, as shown in FIG. 10. As an example, the lateral surface of the first sub-layer 2210, the lateral surface of the second sub-layer 2220, and the lateral surface of the third sub-layer 2230 of the driving voltage line 2200 may be disposed on substantially the same slope surface, and thus, the driving voltage line 2200 does not have the tip structure. Similarly, the lateral surface of the first sub-layer 3210, the lateral surface of the second sub-layer 3220, and the lateral surface of the third sub-layer 3230 of the electrode 3200 may be disposed on substantially the same slope surface, and thus, the electrode 3200 does not have the tip structure. The driving voltage line 2200 and the electrode 3200 may each have substantially a trapezoidal cross-sectional shape, for example, an equilateral trapezoidal cross-sectional shape.

During the process of ashing the first photoresist PR1, the second photoresist PR2 may be also ashed. However, as described above with reference to FIG. 7, because the height and/or the lateral slope angle of the second photoresist PR2 are respectively greater than the height and/or the lateral slope angle of the first photoresist PR1, the end portions (e.g., two opposite end portions or two opposite edge portions) of the auxiliary wiring 1200 may not be exposed while overlapping an ashed second photoresist PR2'. In another embodiment, though the ends portions (or edge portions) of the auxiliary wiring 1200 may be exposed while overlapping the ashed second photoresist PR2, the exposed portion is negligibly small. Accordingly, despite the etching process of removing the end portions (or edge portions) np (see, e.g., FIG. 9) of each of the driving voltage line 2200 and the electrode 3200 that are exposed, the auxiliary wiring 1200 may have the tip structure.

Because the end portions (or edge portions) of the second sub-layer 2220 of the driving voltage line 2200 and the end portions (or edge portions) of the second sub-layer 3220 of the electrode 3200 are removed during the etching process that uses the ashed first photoresist PR1 as a mask, the cross-sectional shape of each of the driving voltage line 2200 and the electrode 3200 may be different from the cross-sectional shape of the auxiliary wiring 1200. As an example, the auxiliary wiring 1200 includes the tip while the driving voltage line 2200 and the electrode 3200 may not include the tip, and each of the driving voltage line 2200 and the electrode 3200 may have substantially a trapezoidal cross-sectional shape, for example, an equilateral trapezoidal cross-sectional shape.

A portion of the interlayer insulating layer 105 may be removed together during the etching process of removing the end portions (or edge portions) np of each of the driving voltage line 2200 and the electrode 3200 exposed without overlapping the ashed first photoresist PR1. Accordingly, the interlayer insulating layer 105 may include a step difference structure, as shown in FIG. 10.

A first thickness **105*t*1 of a first portion of the interlayer insulating layer 105 overlapping the auxiliary wiring 1200 may be greater than a second thickness 105*t*2 of a second portion of the interlayer insulating layer 105 arranged adjacent to (e.g., immediately adjacent to) the first portion and not overlapping the auxiliary wiring 1200. As described above with reference to FIGS. 5 and 6, the upper surface of the first portion of the interlayer insulating layer 105, that is relatively thick, may form a step difference with respect to the upper surface of the second portion of the interlayer insulating layer 105, that is relatively thin. The width of the upper surface of the first portion of the interlayer insulating layer 105 having the first thickness 105*t*1 may be substantially the same as the width of the bottom surface of the auxiliary wiring 1200, for example, the bottom surface of the third sub-layer 1230. Accordingly, the lateral surface 105S1 of the interlayer insulating layer 105 may be continuously connected to the lateral surface of the third sub-layer 1230 of the auxiliary wiring 1200 without forming a step difference with respect to the lateral surface of the third sub-layer 1230 of the auxiliary wiring 1200**.

Similarly, a third thickness **105*t*3 of a third portion of the interlayer insulating layer 105 overlapping the driving voltage line 2200 may be greater than a fourth thickness 105*t*4 of a fourth portion of the interlayer insulating layer 105 arranged adjacent to (e.g., immediately adjacent to) the third portion and not overlapping the driving voltage line 2200. The upper surface of the third portion of the interlayer insulating layer 105, which is relatively thick, may form a step difference with respect to the upper surface of the fourth portion of the interlayer insulating layer 105, which is relatively thin. Similarly, the thickness of a fifth portion of the interlayer insulating layer 105 overlapping the electrode 3200 may be greater than the thickness of a sixth portion of the interlayer insulating layer 105 arranged adjacent to (e.g., immediately adjacent to) the fifth portion and not overlapping the electrode 3200. The upper surface of the fifth portion of the interlayer insulating layer 105, which is relatively thick, may form a step difference with respect to the upper surface of the sixth portion of the interlayer insulating layer 105**, which is relatively thin.

Figure 11:
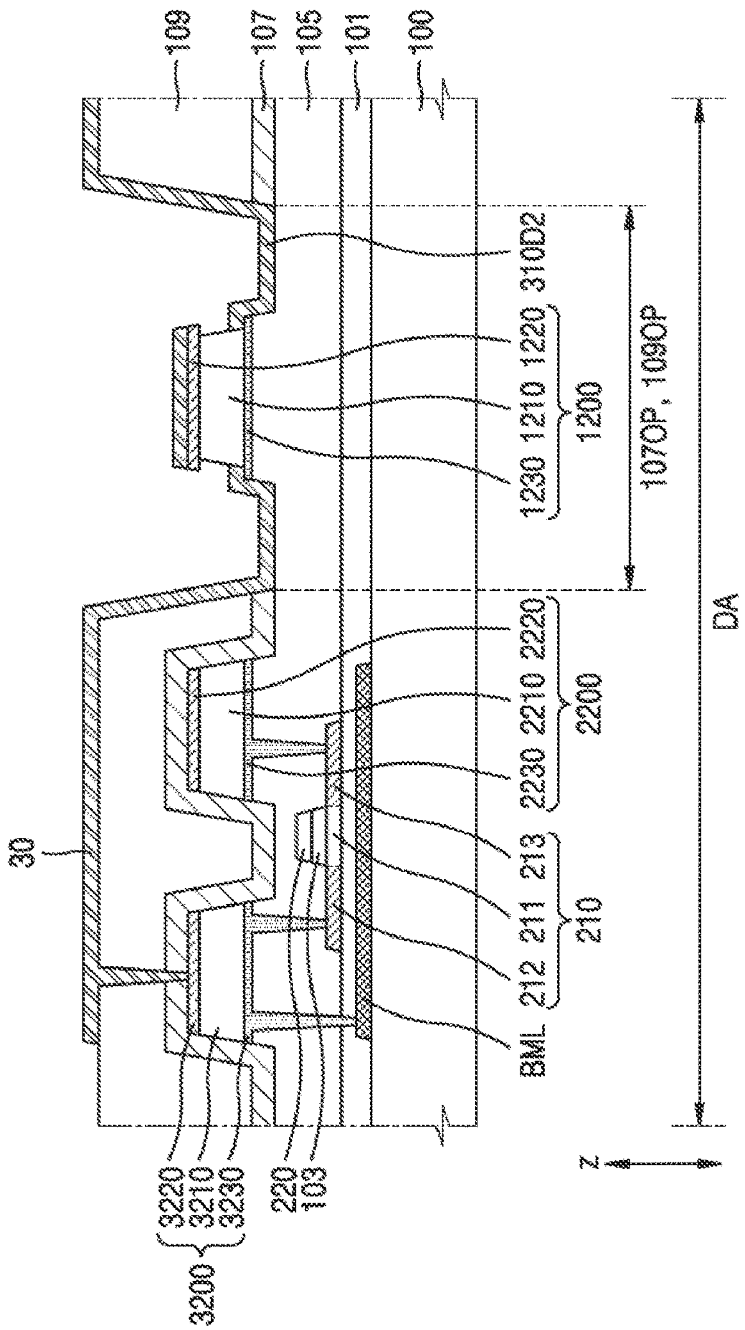

Referring to FIG. 11, at least one insulating layer is formed on the auxiliary wiring 1200, the driving voltage line 2200, and the electrode 3200. In the embodiment shown in FIG. 11, an inorganic protective layer 107 and an organic insulating layer 109 are formed on the auxiliary wiring 1200, the driving voltage line 2200, and the electrode 3200.

The inorganic protective layer 107 and the organic insulating layer 109 may respectively have the openings 107OP and 109OP. The openings 107OP and 109OP in the inorganic protective layer 107 and the organic insulating layer 109 may overlap the auxiliary wiring 1200. The widths of the openings 107OP and 109OP in the inorganic protective layer 107 and the organic insulating layer 109 may be greater than the width of the auxiliary wiring 1200.

Then, an electrode layer 30 is formed on the organic insulating layer 109. The electrode layer 30 may be formed in the display area DA of the substrate 100. The electrode layer 30 may be electrically connected to the electrode 3200 through a contact hole (or contact opening) passing through the inorganic protective layer 107 and the organic insulating layer 109.

The electrode layer 30 may include a transparent conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the electrode layer 30 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the electrode layer 30 may further include a layer on/under the reflective layer, the layer including ITO, IZO, ZnO, or $In_2O_3$. As an example, the electrode layer 30 may have a three-layer structure of including an ITO layer, an Ag layer, and an ITO layer.

The electrode layer 30 may overlap the auxiliary wiring 1200 in the openings 107OP and 109OP in the inorganic protective layer 107 and the organic insulating layer 109. A portion of the electrode layer 30 may be disposed on the auxiliary wiring 1200 while directly contacting the upper surface of the auxiliary wiring 1200, for example, the upper surface of the second sub-layer 1220 due to the tip structure of the auxiliary wiring 1200. A portion of the electrode layer 30 disposed on the auxiliary wiring 1200 may be separated and spaced apart from (e.g., disconnect from) another portion of the electrode layer 30 adjacent to the lateral surface of the auxiliary wiring 1200. The other portion of the electrode layer 30 arranged adjacent to the lateral surface of the auxiliary wiring 1200 may directly contact the lateral surface of the first sub-layer 1210 of the auxiliary wiring 1200.

Figure 12:
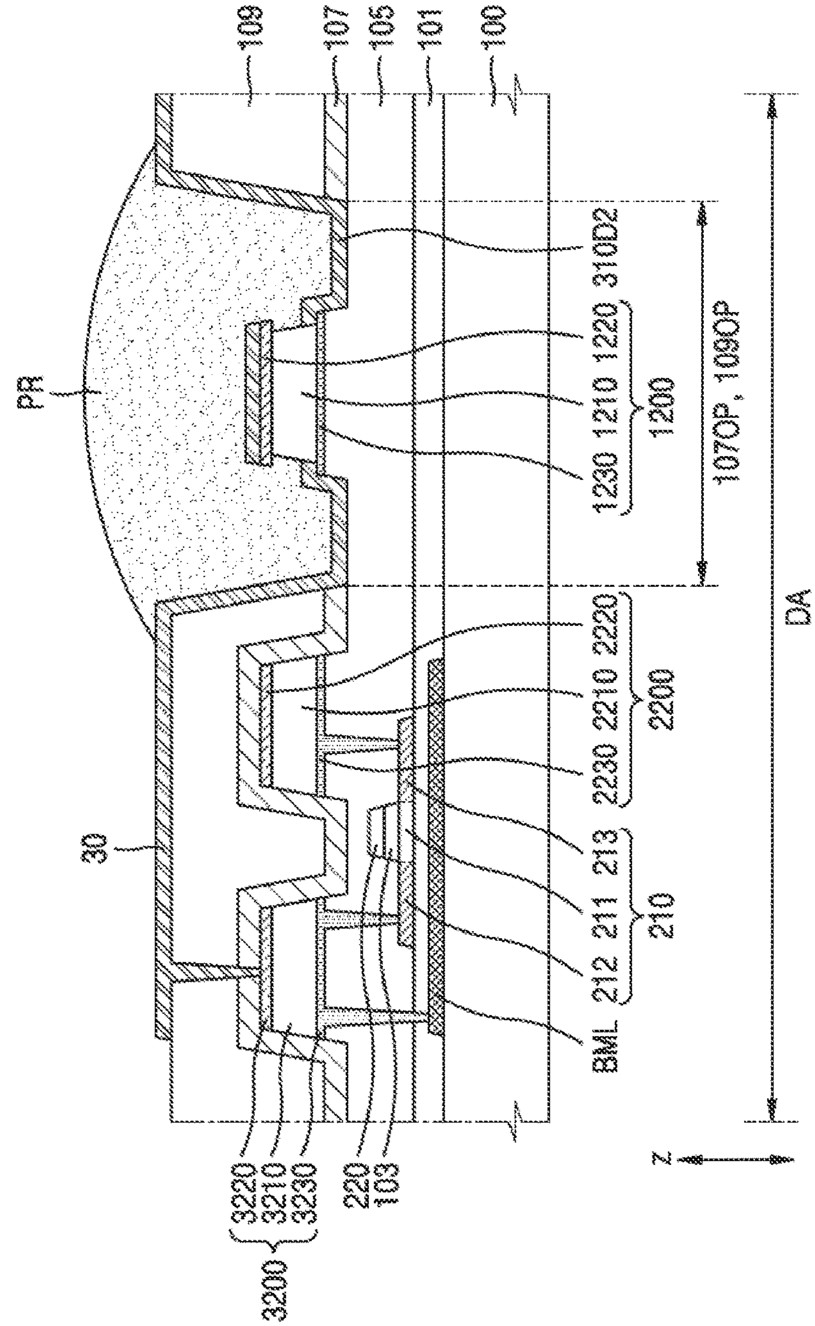
Figure 13:
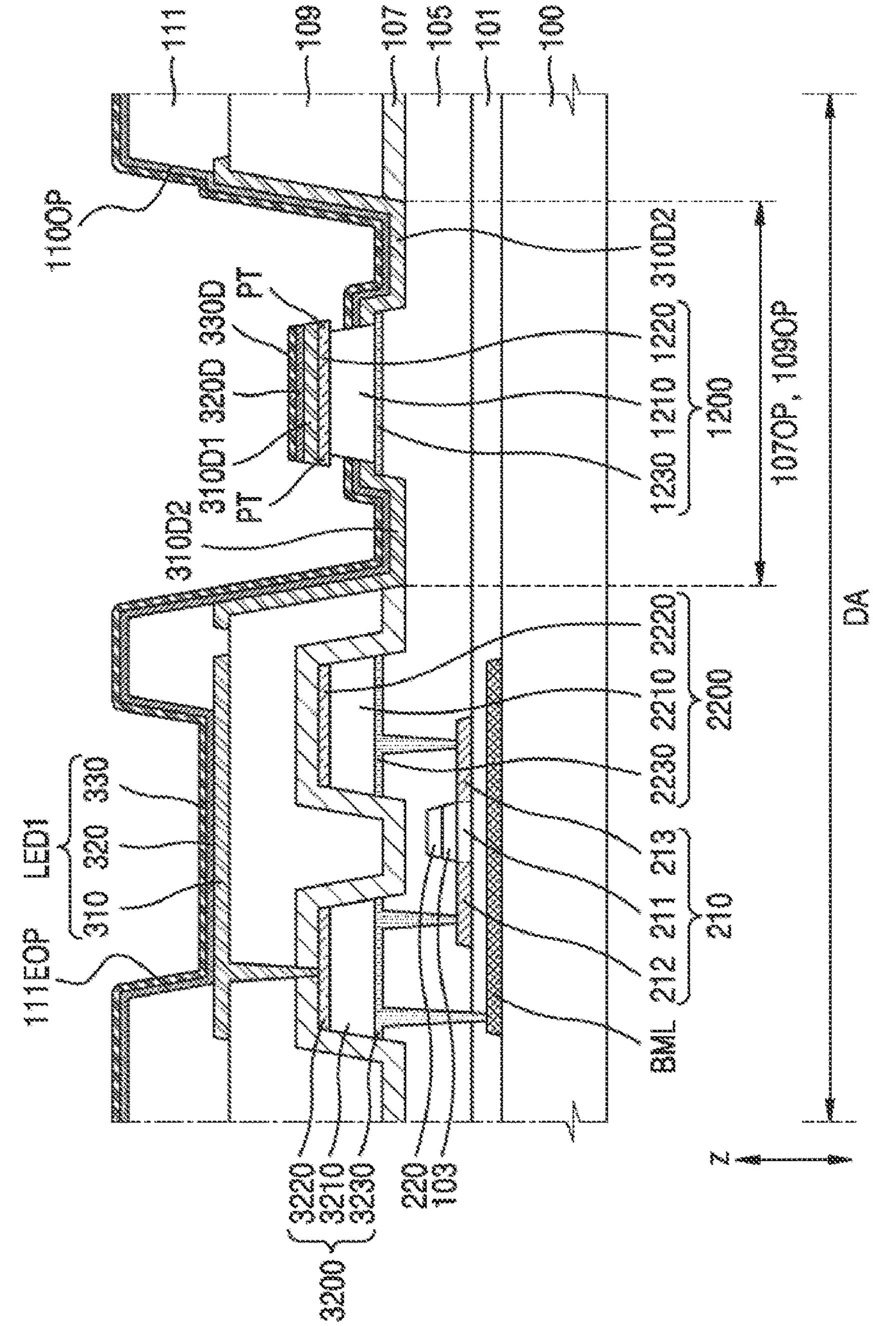

Then, as shown in FIG. 12, the photoresist PR is formed on the auxiliary wiring 1200. Then, as shown in FIG. 13, the first electrode 310 may be formed by etching (e.g., wet etching) the electrode layer 30. One portion of the electrode layer 30 that is not removed during the etching process of forming the first electrode 310 may be disposed on the auxiliary wiring 1200, and another portion thereof may be disposed around the auxiliary wiring 1200. The portion of the electrode layer 30 remaining on the auxiliary wiring 1200 corresponds to the first conductive material portion 310D1 described above with reference to FIG. 5, and the portion of the electrode layer 30 remaining around the auxiliary wiring 1200 corresponds to the second conductive material portion 310D2 described above with reference to FIG. 5. The first conductive material portion 310D1 may be separated and spaced apart from (e.g., disconnected from) the second conductive material portion 310D2. After the first electrode 310 is formed, the photoresist PR may be removed.

Referring to FIG. 13, a bank layer 111 covering the edges of the first electrode 310 and exposing a portion of the first electrode 310 may be formed. The bank layer 111 may have an emission opening 111EOP and an opening 110OP. The emission opening 111EOP overlaps the first electrode 310, and the opening 110OP overlaps the auxiliary wiring 1200. The bank layer 111 may also cover an end (or edge) (e.g., an end far away from the auxiliary wiring 1200) of the second conductive material portion 310D2.

The intermediate layer 320 and the second electrode 330 may be formed on the bank layer 111 by using an open mask having an opening area overlapping the display area DA. As described above with reference to FIG. 6, the intermediate layer 320 may include the emission layer and at least one functional layer. The overlapping structure of the first electrode 310, the intermediate layer 320, and the second electrode 330 may be configured to form a light-emitting diode, for example, the first light-emitting diode LED1 shown in FIG. 13.

The intermediate layer 320 and the second electrode 330 may be formed by a deposition method, such as a thermal deposition. The intermediate layer 320 and the second electrode 330 may be deposited by using an open mask having an opening area corresponding to the display area DA.

A deposition material forming the intermediate layer 320 may be also deposited on the auxiliary wiring 1200, and the material of the intermediate layer 320 deposited on the auxiliary wiring 1200 may form the dummy intermediate layer 320D. Because the intermediate layer 320 is formed through the open mask, the intermediate layer 320 may directly contact the lateral surface of the auxiliary wiring 1200, for example, the lateral surface of the first sub-layer 1210.

Similarly, a deposition material forming the second electrode 330 may be also deposited on the auxiliary wiring 1200, and the material of the second electrode 330 deposited on the auxiliary wiring 1200 may form the dummy electrode 330D. Because the second electrode 330 is formed through the open mask, the second electrode 330 may directly contact the lateral surface of the auxiliary wiring 1200, for example, the lateral surface of the first sub-layer 1210.

A contact structure between the intermediate layer 320 and the second electrode 330 is the same as that described above with reference to FIG. 6.

Figure 14:
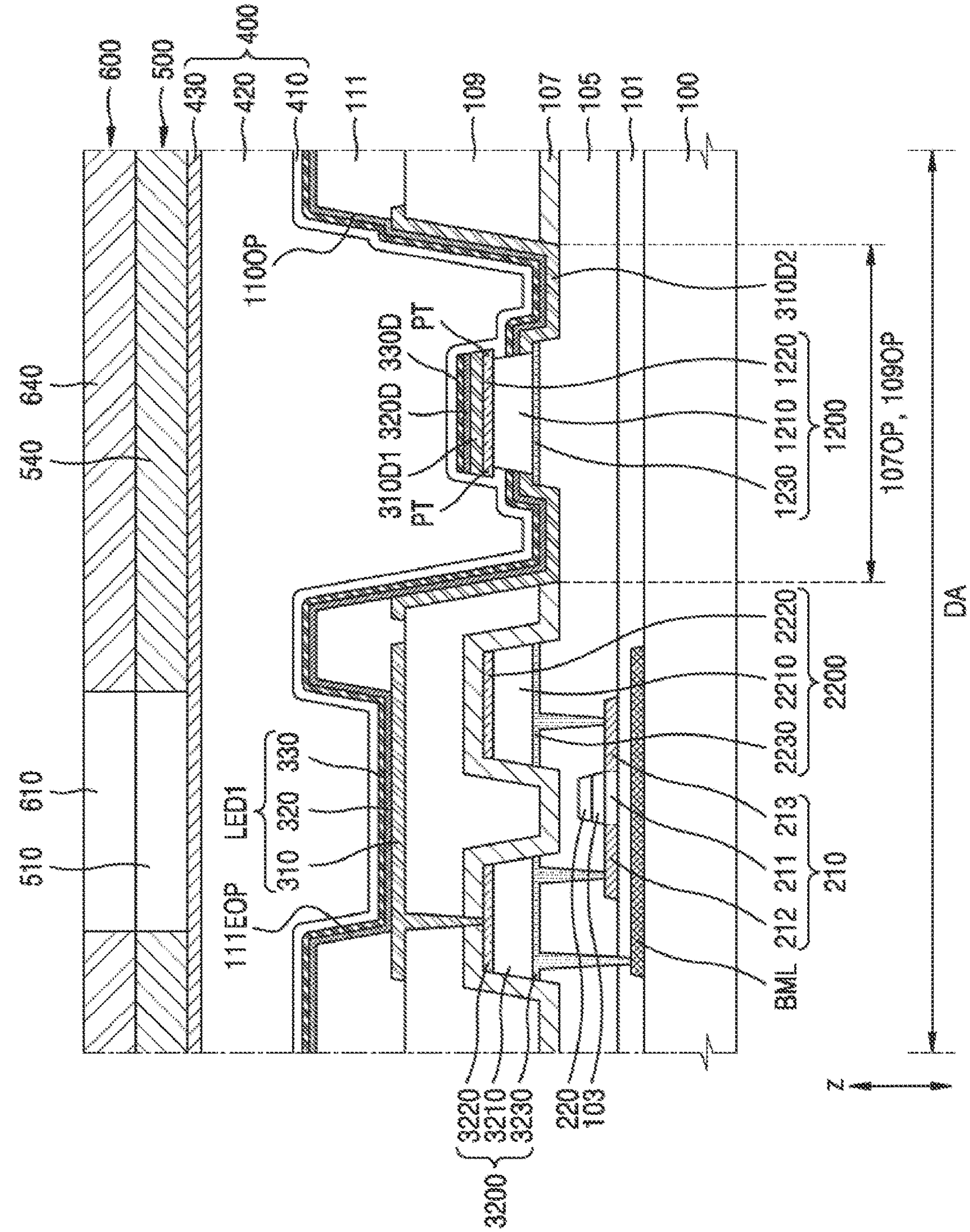

Referring to FIG. 14, the encapsulation layer 400 may be formed on the first light-emitting diode LED1. The encapsulation layer 400 may include the first inorganic encapsulation layer 410, the organic encapsulation layer 420, and the second inorganic encapsulation layer 430.

The first inorganic encapsulation layer 410 has a relatively excellent step coverage and may continuously (or entirely) cover the structure on the auxiliary wiring 1200 and the structures on two opposite sides of the auxiliary wiring 1200. For example, the first inorganic encapsulation layer 410 may continuously extend to overlap the upper surface and the lateral surface of the dummy electrode 330D disposed on the auxiliary wiring 1200, the lateral surface of the dummy intermediate layer 320D, the lateral surface of the first conductive material portion 310D1, the lateral surface and the bottom surface of the tip PT, the lateral surface of the first sub-layer 1210, and the upper surface of the second electrode 330 contacting the lateral surface of the first sub-layer 1210. The first inorganic encapsulation layer 410 may be formed by chemical vapor deposition.

The organic encapsulation layer 420 may include a polymer-based material. The organic encapsulation layer 420 may be formed by coating monomer of a polymer-based material by using an inkjet method and then curing the same. Similar to the first inorganic encapsulation layer 410, the second inorganic encapsulation layer 430 may be formed by the chemical vapor deposition and the like.

Then, the color conversion-transmissive layer 500 and the color layer 600 may be formed. In this regard, it is shown in FIG. 14 that a first color-converter 510 of the color conversion-transmissive layer 500 is arranged to overlap the first light-emitting diode LED1, and a first color filter 610 of the color layer 600 is arranged to overlap the first light-emitting diode LED1. The first color-converter 510 and the first color filter 610 may be respectively surrounded by light-blocking portions 540 and 640.

In this regard, FIG. 14 shows the light-blocking portions 540 and 640 disposed on two opposite sides of each of the first color-converter 510 and the first color filter 610. The light-blocking portions 540 and 640 may include a light-blocking material, such as a black matrix, and the auxiliary wiring 1200 may overlap the light-blocking portions 540 and 640.

The color conversion-transmissive layer 500 and the color layer 600 may be directly formed on the encapsulation layer 400. In another embodiment, the color conversion-transmissive layer 500 and the color layer 600 may be formed on a separate substrate. In the structure of the color conversion-transmissive layer 500 and the color layer 600 formed on the separate substrate, the color conversion-transmissive layer 500 may be disposed to face the encapsulation layer 400.

Figure 15:
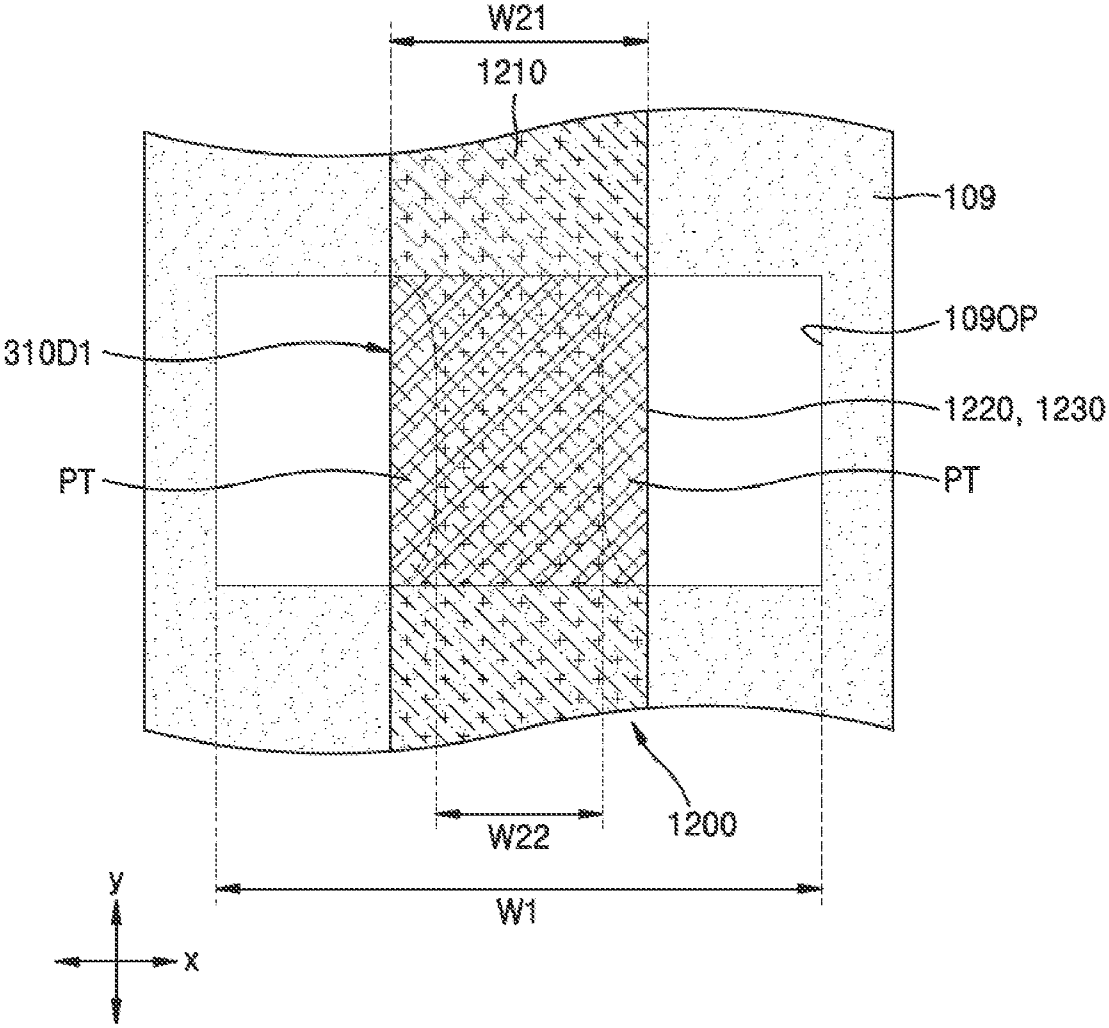
FIG. 15 is a schematic plan view of an auxiliary wiring, an organic insulating layer, and a first conductive material portion according to an embodiment.

FIG. 15 is a schematic plan (or plane) view of an auxiliary wiring, an organic insulating layer, and a first conductive material portion according to an embodiment.

Referring to FIG. 15, the auxiliary wiring 1200 may extend in one direction (e.g., the y direction), and the organic insulating layer 109 may be disposed on the auxiliary wiring 1200. The organic insulating layer 109 may have an opening 109OP overlapping a portion of the auxiliary wiring 1200.

A width W1 of the opening 109OP in the organic insulating layer 109 may be greater than the width of the auxiliary wiring 1200. As described above with reference to FIGS. 5 and 6, the auxiliary wiring 1200 may include the first sub-layer 1210, the second sub-layer 1220, and the third sub-layer 1230. Because a portion of the first sub-layer 1210 overlapping the opening 109OP in the organic insulating layer 109 is etched, a width W22 of the portion of the first sub-layer 1210 overlapping the opening 109OP in the organic insulating layer 109 may be less than a width W21 of another portion of the first sub-layer 1210 not overlapping the opening 109OP in the organic insulating layer 109. For example, the width W21 of the other portion of the first sub-layer 1210 disposed under the organic insulating material of the organic insulating layer 109 may be greater than the width W22 of the portion of the first sub-layer 1210 overlapping the opening 109OP in the organic insulating layer 109.

Because the second sub-layer 1220 is not etched, the second sub-layer 1220 may have the tip PT extending from one lateral surface of the first sub-layer 1210. In a plane view, the width of the second sub-layer 1220 overlapping the opening 109OP in the organic insulating layer 109 may be greater than the width W22 of the first sub-layer 1210 overlapping the opening 109OP in the organic insulating layer 109.

The tip PT of the second sub-layer 1220 may correspond to a portion not overlapping the first sub-layer 1210 in a plane view. The tip PT may overlap the first conductive material portion 310D1. The first conductive material portion 310D1 may be disposed on the auxiliary wiring 1200 through the opening 109OP in the organic insulating layer 109, and the width of the first conductive material portion 310D1 may be substantially the same as the width of the second sub-layer 1220 overlapping the opening 109OP in the organic insulating layer 109.

According to embodiments of the present disclosure, because the second electrode of the light-emitting diode is connected to the auxiliary wiring, a voltage drop may be prevented, and the tip structure may be formed on the auxiliary wiring without damage to the auxiliary wiring. However, the scope of the present disclosure is not limited by these aspects and features.

It should be understood that the embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
- a substrate;
- a transistor on the substrate, the transistor comprising a semiconductor layer and a gate electrode overlapping the semiconductor layer;
- an auxiliary wiring on the substrate and comprising a first sub-layer and a second sub-layer on the first sub-layer, the second sub-layer having a tip protruding from a point where a bottom surface of the second sub-layer meets a lateral surface of the first sub-layer;
- an insulating layer on the transistor and having an opening overlapping the auxiliary wiring;
- a light-emitting diode comprising a first electrode, a second electrode, and an intermediate layer, the first electrode being on the insulating layer and electrically connected to the transistor, the second electrode facing the first electrode, and the intermediate layer being between the first electrode and the second electrode; and
- a first conductive material portion on an upper surface of the auxiliary wiring and a second conductive material portion separated from the first conductive material portion by the tip of the second sub-layer of the auxiliary wiring, the first conductive material portion and the second conductive material portion being the same layer as the first electrode,
- wherein the second electrode directly contacts the lateral surface of the first sub-layer.

2. The display apparatus of claim 1, wherein each of the first conductive material portion and the second conductive material portion comprises a same material as a material of the first electrode of the light-emitting diode.

3. The display apparatus of claim 2, wherein the second conductive material portion is adjacent to a lateral surface of the auxiliary wiring.

4. The display apparatus of claim 1, wherein a thickness of the first sub-layer of the auxiliary wiring is greater than a thickness of the second sub-layer of the auxiliary wiring, and
- wherein the lateral surface of the first sub-layer of the auxiliary wiring has an inclined surface tapered upwardly.

5. The display apparatus of claim 1, wherein the first sub-layer of the auxiliary wiring comprises at least one selected from copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo), and wherein the second sub-layer of the auxiliary wiring comprises at least one selected from indium tin oxide (ITO), titanium (Ti), molybdenum (Mo), and tungsten (W).

6. The display apparatus of claim 1, wherein the auxiliary wiring further comprises a third sub-layer opposite the second sub-layer with the first sub-layer therebetween.

7. The display apparatus of claim 1, further comprising an electrode or a driving voltage line electrically connected to the semiconductor layer of the transistor.

8. The display apparatus of claim 7, wherein the electrode or the driving voltage line comprises a same number of sub-layers as a number of sub-layers of the auxiliary wiring.

9. The display apparatus of claim 7, wherein a cross-sectional shape of the electrode or the driving voltage line is different from a cross-sectional shape of the auxiliary wiring.

10. The display apparatus of claim 7, wherein the insulating layer is on the electrode or the driving voltage line, and wherein a portion of the insulating layer overlaps a lateral surface of the electrode or the driving voltage line.

11. The display apparatus of claim 1, further comprising another insulating layer between the substrate and the auxiliary wiring, wherein the other insulating layer has a first portion overlapping the auxiliary wiring and a second portion not overlapping the auxiliary wiring and adjacent to the first portion, and wherein a thickness of the first portion is greater than a thickness of the second portion.

* * * * *